US009183935B2

(12) United States Patent
Fukuzumi

(10) Patent No.: US 9,183,935 B2
(45) Date of Patent: Nov. 10, 2015

(54) SEMICONDUCTOR MEMORY DEVICE HAVING PROGRAMMABLE SELECT TRANSISTORS WITHIN MEMORY UNITS

(71) Applicant: KABUSHIKI KAISHA TOSHIBA, Minato-ku (JP)

(72) Inventor: Yoshiaki Fukuzumi, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 142 days.

(21) Appl. No.: 14/017,725

(22) Filed: Sep. 4, 2013

(65) Prior Publication Data

US 2014/0085989 A1   Mar. 27, 2014

(30) Foreign Application Priority Data

Sep. 21, 2012 (JP) ................. 2012-208787

(51) Int. Cl.
*G11C 16/06* (2006.01)
*G11C 16/08* (2006.01)
*G11C 16/04* (2006.01)
*G11C 16/10* (2006.01)
G11C 29/02 (2006.01)
G11C 29/50 (2006.01)

(52) U.S. Cl.
CPC ............ *G11C 16/08* (2013.01); *G11C 16/0483* (2013.01); *G11C 16/10* (2013.01); *G11C 29/028* (2013.01); *G11C 2029/5002* (2013.01)

(58) Field of Classification Search
CPC ..... G11C 16/08; G11C 16/10; G11C 16/0483
USPC .................................... 365/185.23
See application file for complete search history.

(56) References Cited

U.S. PATENT DOCUMENTS

| 7,894,263 | B2 * | 2/2011 | Lee et al. ............... 365/185.17 |
| 7,983,084 | B2 * | 7/2011 | Tokiwa et al. .......... 365/185.11 |
| 8,867,271 | B2 * | 10/2014 | Li et al. ............... 365/185.09 |
| 2007/0252201 | A1 | 11/2007 | Kito et al. |
| 2009/0086542 | A1 * | 4/2009 | Lee et al. ............... 365/185.17 |
| 2010/0097858 | A1 * | 4/2010 | Tokiwa et al. .......... 365/185.05 |
| 2011/0051527 | A1 | 3/2011 | Kirisawa et al. |
| 2011/0075481 | A1 | 3/2011 | Fukuzumi et al. |
| 2011/0188321 | A1 | 8/2011 | Kito et al. |

(Continued)

FOREIGN PATENT DOCUMENTS

| JP | 2007-266143 | 10/2007 |
| JP | 2009-146954 | 7/2009 |

(Continued)

*Primary Examiner* — Vanthu Nguyen
*Assistant Examiner* — Xiaochun L Chen
(74) *Attorney, Agent, or Firm* — Oblon, McClelland, Maier & Neustadt, L.L.P.

(57) ABSTRACT

A semiconductor memory device includes memory units, each of which includes first and second select transistors and memory cells connected in series between the first and second select transistors. A control circuit applies a first potential difference between a source and a drain of either the first or second select transistor in a first memory unit, thereby programming either the first or second select transistor. The control circuit applies a second potential difference between a source and a drain of either the first or second select transistor in a second memory unit connected in common to the same select gate line as that of the first memory unit, thereby inhibiting either the first or second select transistor from being programmed.

17 Claims, 18 Drawing Sheets

| | SDT program | | | SST program | | |
|---|---|---|---|---|---|---|
| | Selected MB | | Unselected MB | Selected MB | | Unselected MB |
| | Selected MU | Unselected MU | | Selected MU | Unselected MU | |
| VBL for PROG | 0V⇒9V | 0V⇒9V | 0V⇒9V | 9V⇒0V | 9V⇒0V | 9V⇒0V |
| VBL for INHIBIT | 0V | 0V | 0V | 9V | 9V | 9V |
| VSGD | 12V | 3V | 3V | 5V | 5V | 3V |
| VDUMD | 1V | 1V | 0V | 5V | 5V | 0V |
| VCGxx | 5V | 5V | 0V | 5V | 5V | 0V |
| VDUMS | 5V | 5V | 0V | 1V | 1V | 0V |
| VSGS | 5V | 5V | 0V | 12V | 3V | 3V |
| VSL | 0V | 0V | 0V | 9V | 9V | 9V |

(56) References Cited

U.S. PATENT DOCUMENTS

2011/0211392 A1*  9/2011  Kim et al. .................. 365/185.2
2011/0216604 A1   9/2011  Mikajiri et al.
2013/0126961 A1   5/2013  Fukuzumi et al.
2013/0322174 A1* 12/2013  Li et al. .................... 365/185.09

FOREIGN PATENT DOCUMENTS

| JP | 2011-54234 | 3/2011 |
| JP | 2011-70730 | 4/2011 |
| JP | 2011-159362 | 8/2011 |
| JP | 2011-187110 | 9/2011 |

* cited by examiner

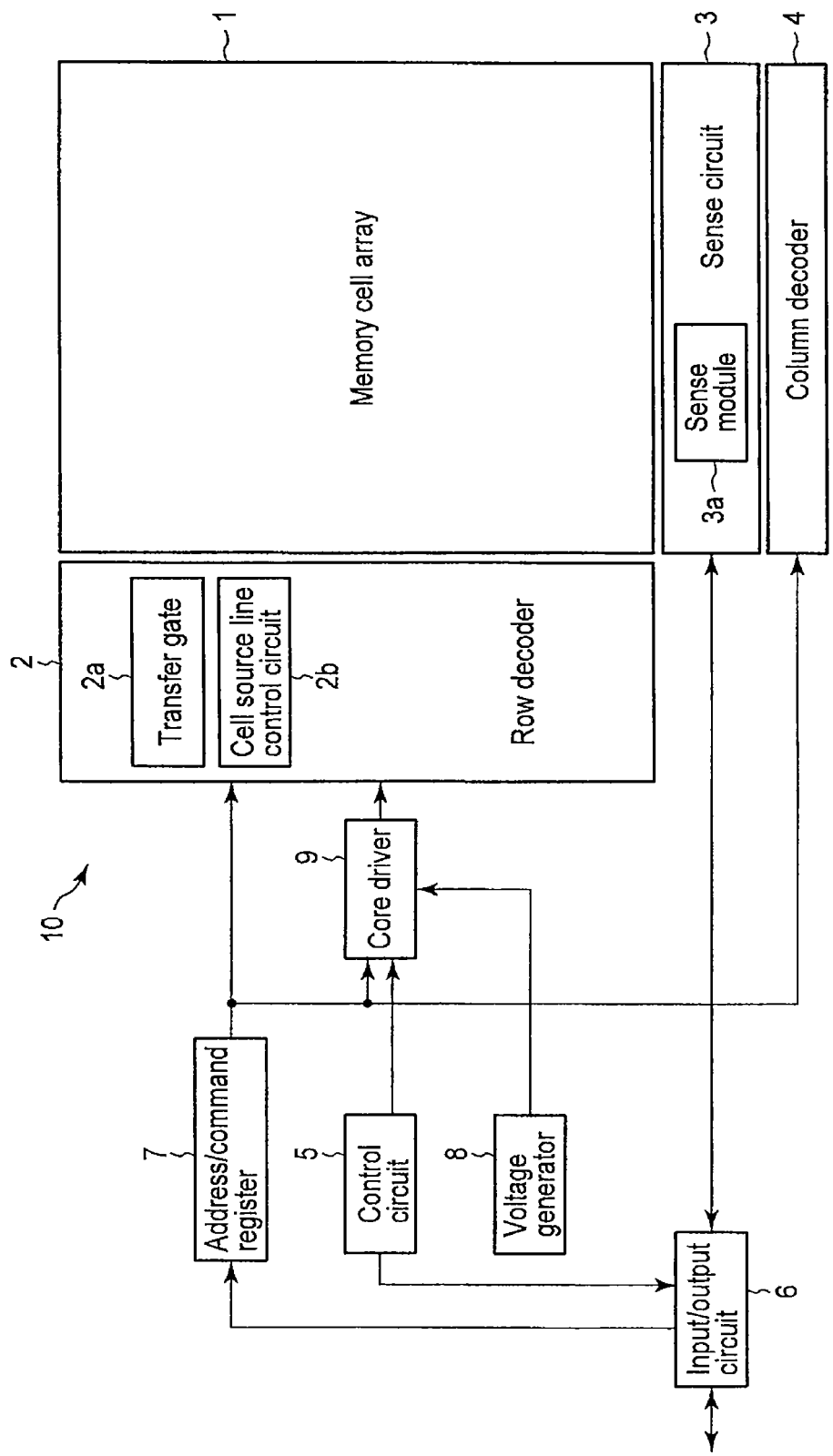
F I G. 1

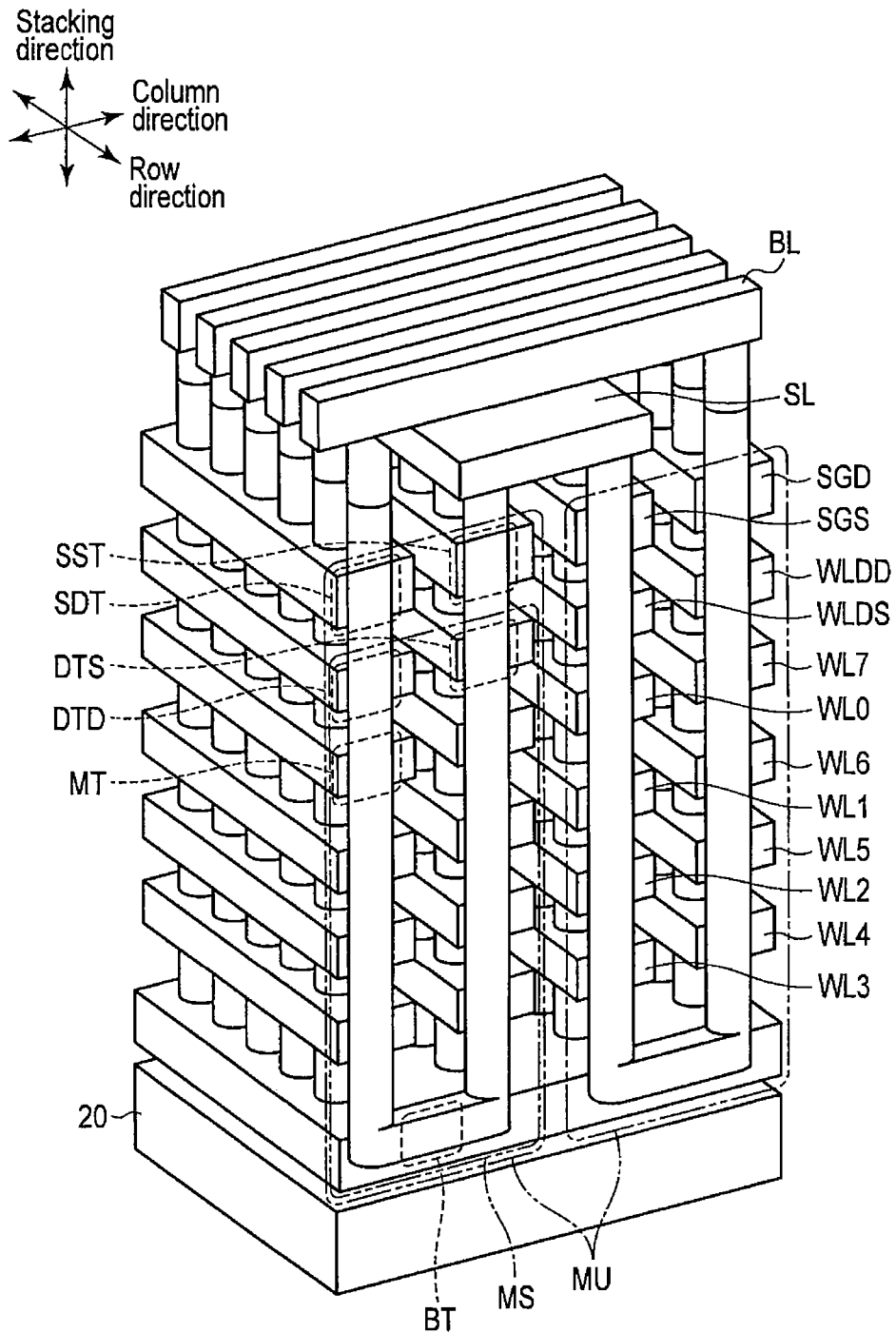
F I G. 2

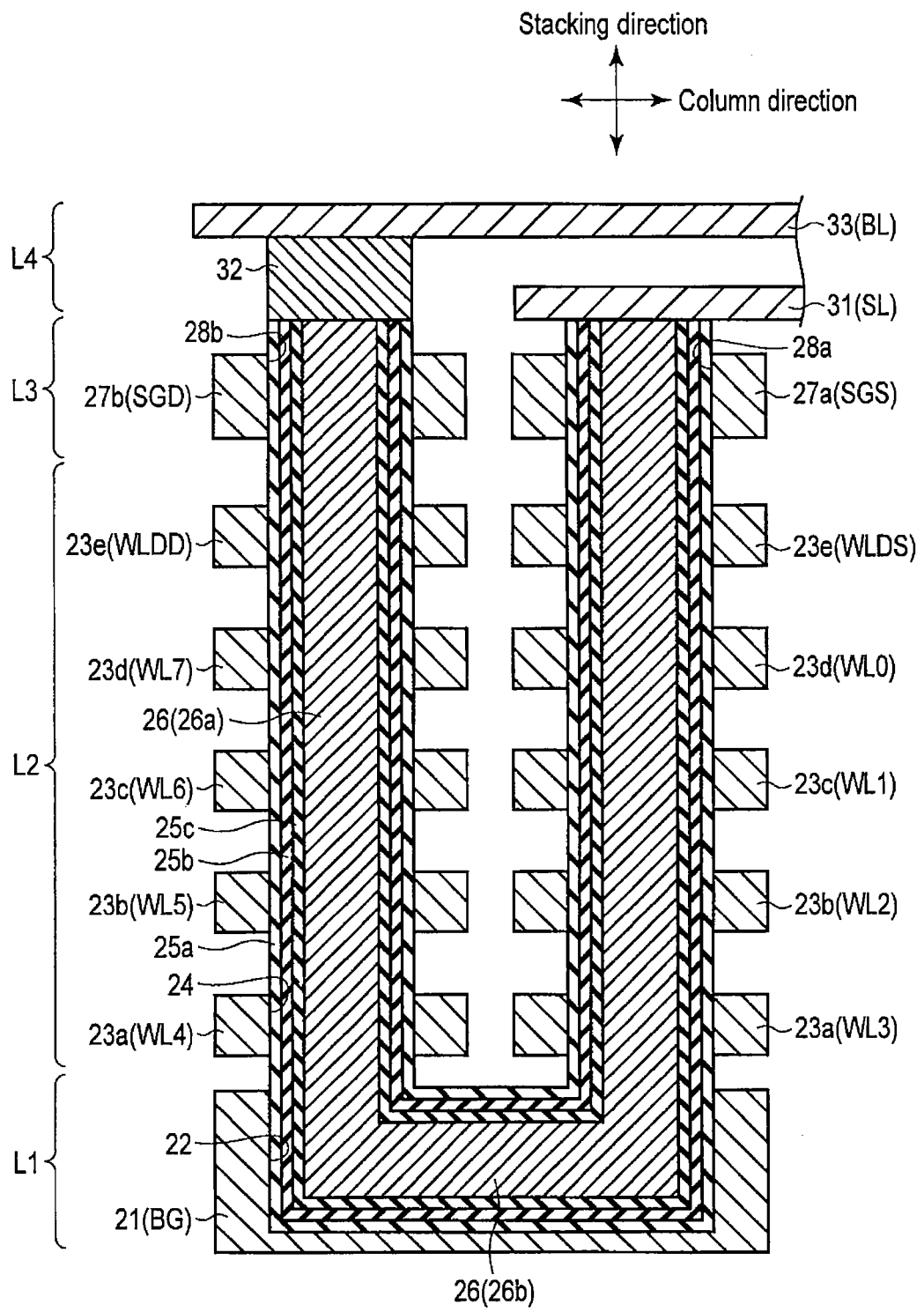
F I G. 4

|  | SDT program | | | | SST program | | | |
|---|---|---|---|---|---|---|---|---|
|  | Selected MB | | Unselected MB | | Selected MB | | Unselected MB | |
|  | Selected MU | Unselected MU | Selected MU | Unselected MU | Selected MU | Unselected MU | Selected MU | Unselected MU |
| VBL for PROG | 0V⇒9V | 0V⇒9V | 0V⇒9V | 0V⇒9V | 9V⇒0V | 9V⇒0V | 9V⇒0V | 9V⇒0V |
| VBL for INHIBIT | 0V | 0V | 0V | 0V | 9V | 9V | 9V | 9V |
| VSGD | 12V | 3V | 3V | 3V | 5V | 5V | 5V | 3V |
| VDUMD | 1V | 1V | 0V | 0V | 5V | 5V | 5V | 0V |
| VCGxx | 5V | 5V | 0V | 0V | 5V | 5V | 5V | 0V |
| VDUMS | 5V | 5V | 0V | 0V | 1V | 1V | 1V | 0V |
| VSGS | 5V | 5V | 0V | 0V | 12V | 3V | 3V | 3V |
| VSL | 0V | 0V | 0V | 0V | 9V | 9V | 9V | 9V |

F I G. 9

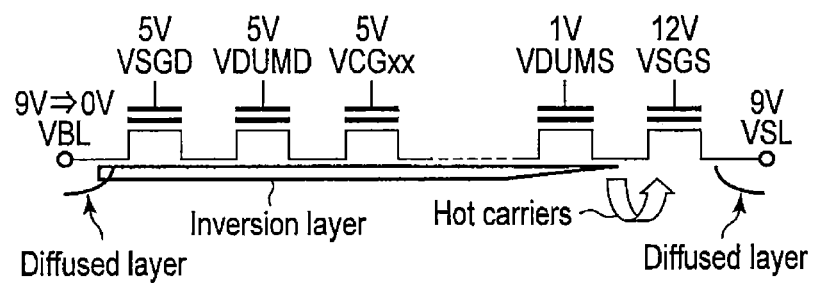
F I G. 10
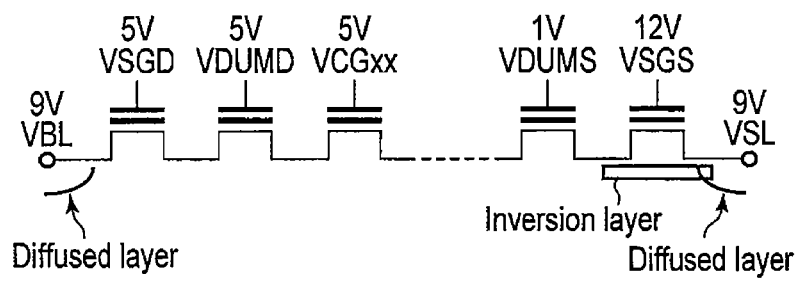
F I G. 11

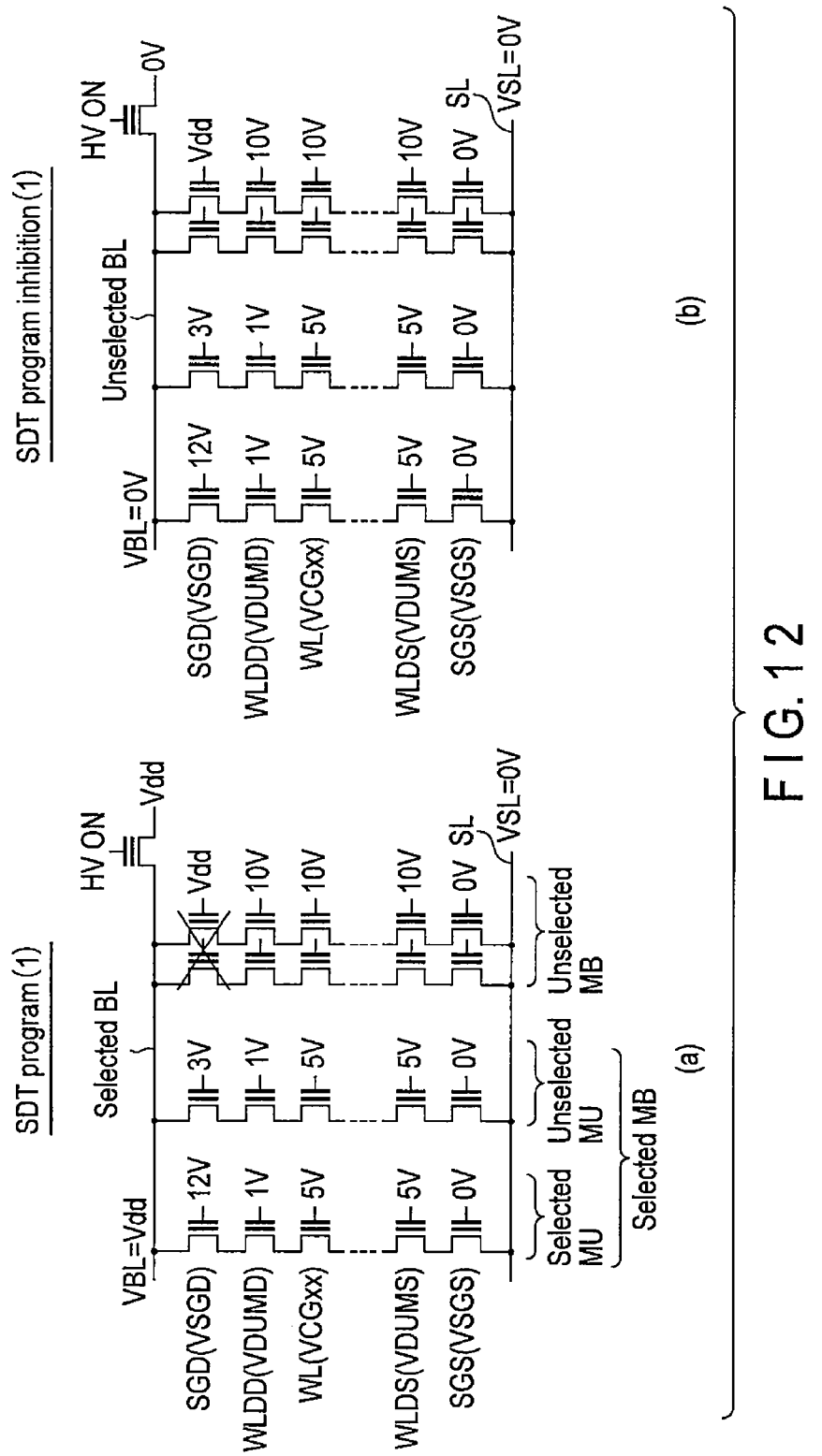
F I G. 12

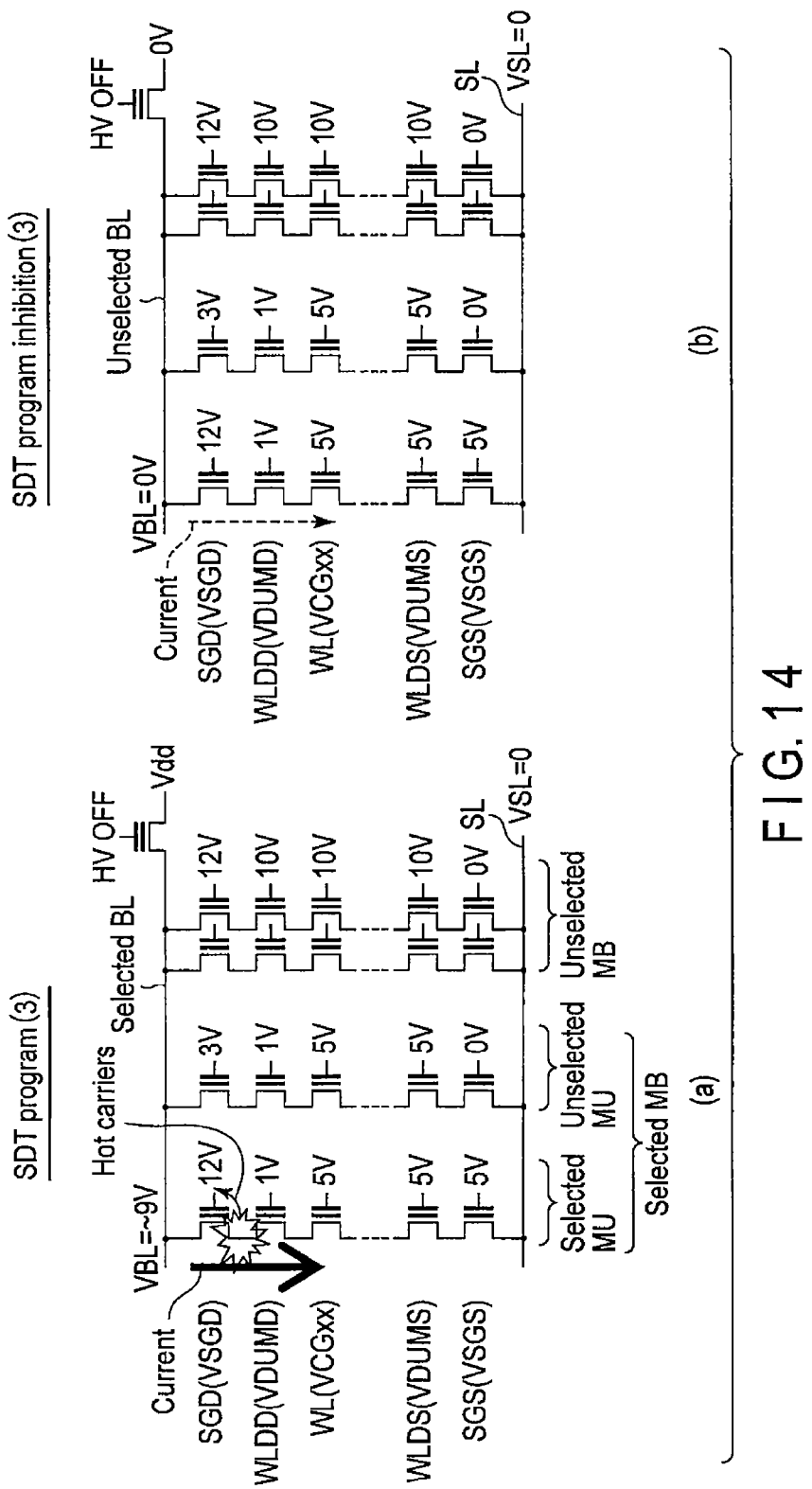
F I G. 14

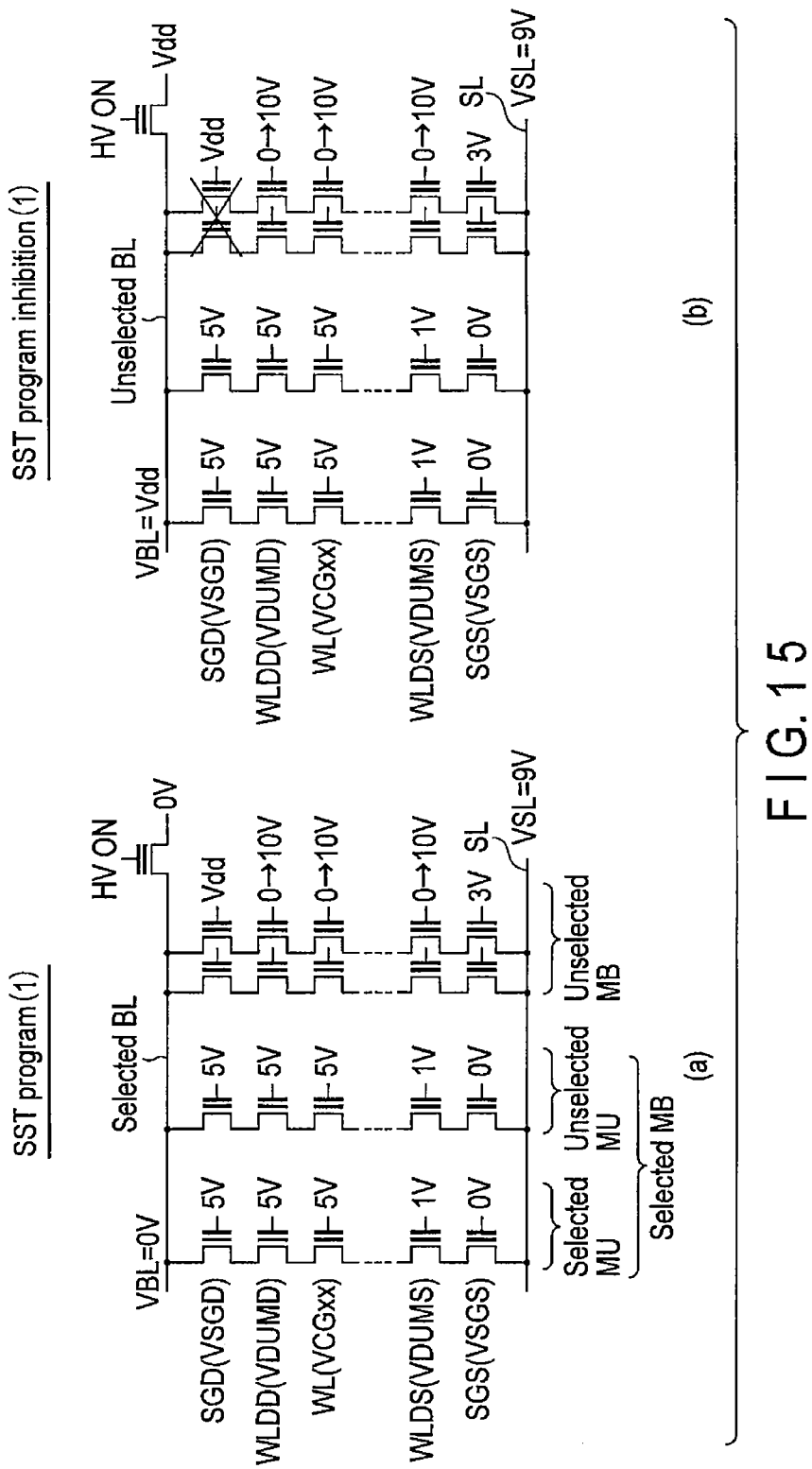
F I G. 15

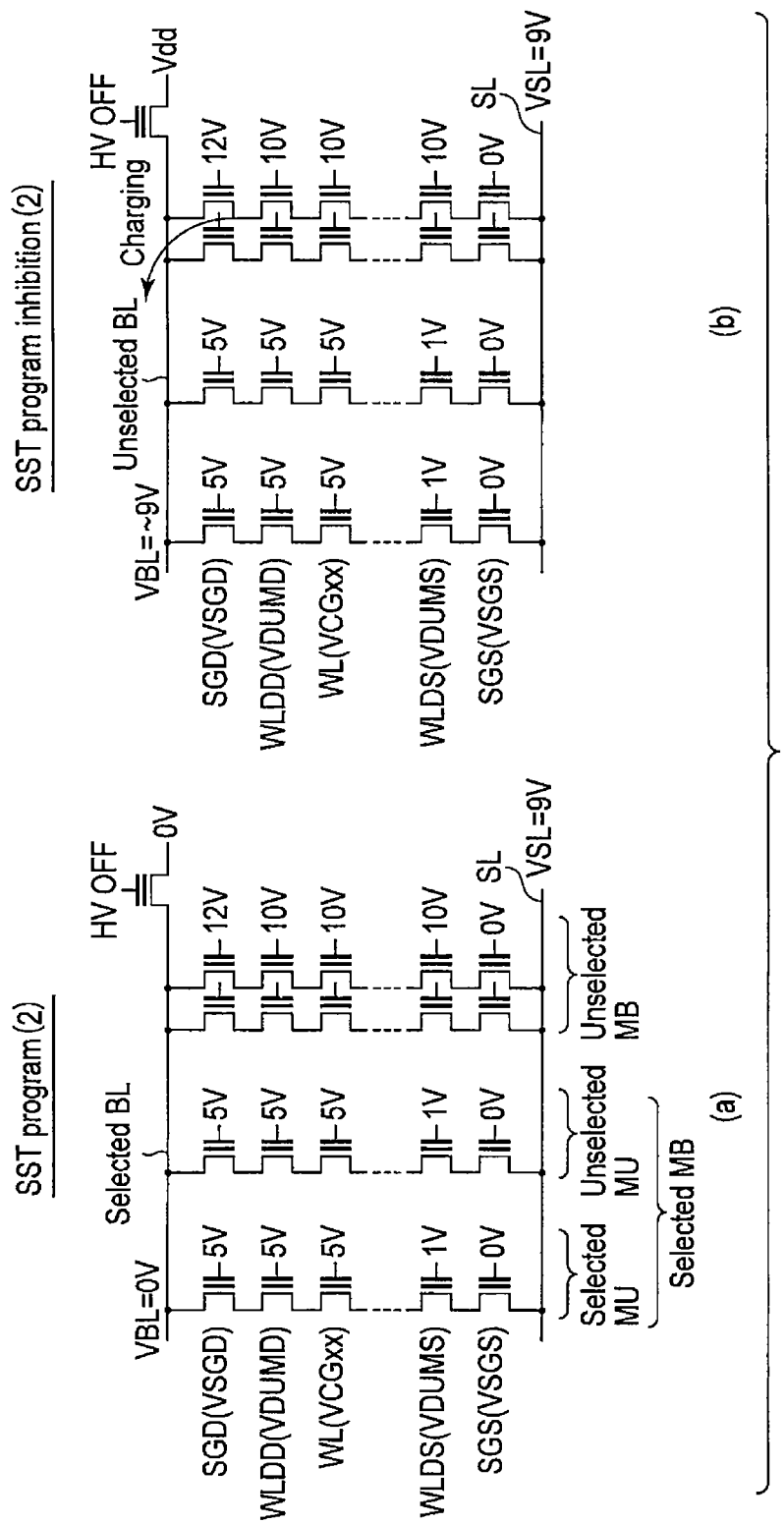
F I G. 16

SEMICONDUCTOR MEMORY DEVICE HAVING PROGRAMMABLE SELECT TRANSISTORS WITHIN MEMORY UNITS

CROSS-REFERENCE TO RELATED APPLICATIONS

This application is based upon and claims the benefit of priority from Japanese Patent Application No. 2012-208787, filed Sep. 21, 2012; the entire contents of which are incorporated herein by reference.

FIELD

Embodiments described herein relate generally to a semiconductor memory device.

BACKGROUND

A NAND flash memory where memory cells are arranged three-dimensionally has been known. In such a stacked NAND flash memory, a memory film (charge storage film) similar to that of a memory cell part is formed in a select transistor part to reduce the process cost. Although it is desirable to use the same polycrystalline semiconductor layer as that of the memory cell part as a channel material, there is concern that the threshold voltage of a select transistor supposed to be constant is liable to vary under the influence of polycrystalline grains or grain-boundary levels.

In the case of a planar NAND flash memory where memory cells are arranged two-dimensionally, a single crystal semiconductor substrate is generally used as a channel material and a variation in the threshold voltage caused by the channel film quality is small. The threshold voltage can be adjusted by ion-injecting impurities into the channel part. However, in the case of a stacked memory, not only is the channel material a polycrystalline film, but also the channel film is thin. Therefore, the threshold voltage is difficult to adjust by injecting impurities for a similar reason that the threshold is generally difficult to adjust in an ultrathin-film SOI device.

BRIEF DESCRIPTION OF THE DRAWINGS

FIG. 1 is a block diagram of a semiconductor memory device according to a first embodiment;

FIG. 2 is a perspective view of a part of a memory cell array;

FIG. 4 is a sectional view of the memory cell array;

FIG. 9 is a table to explain the voltage relationship in programming the select transistor;

FIG. 10 is a diagram to explain a program operation of a source-side select transistor;

FIG. 11 is a diagram to explain the operation of inhibiting the source-side select transistor from being programmed;

FIG. 12 is a diagram to explain a first step of a program operation of a drain-side select transistor according to a second embodiment;

FIG. 14 is a diagram to explain a third step of the program operation of the drain-side select transistor;

FIG. 15 is a diagram to explain a first step of a program operation of a source-side select transistor;

FIG. 16 is a diagram to explain a second step of the program operation of the source-side select transistor;

DETAILED DESCRIPTION

Figure 3:
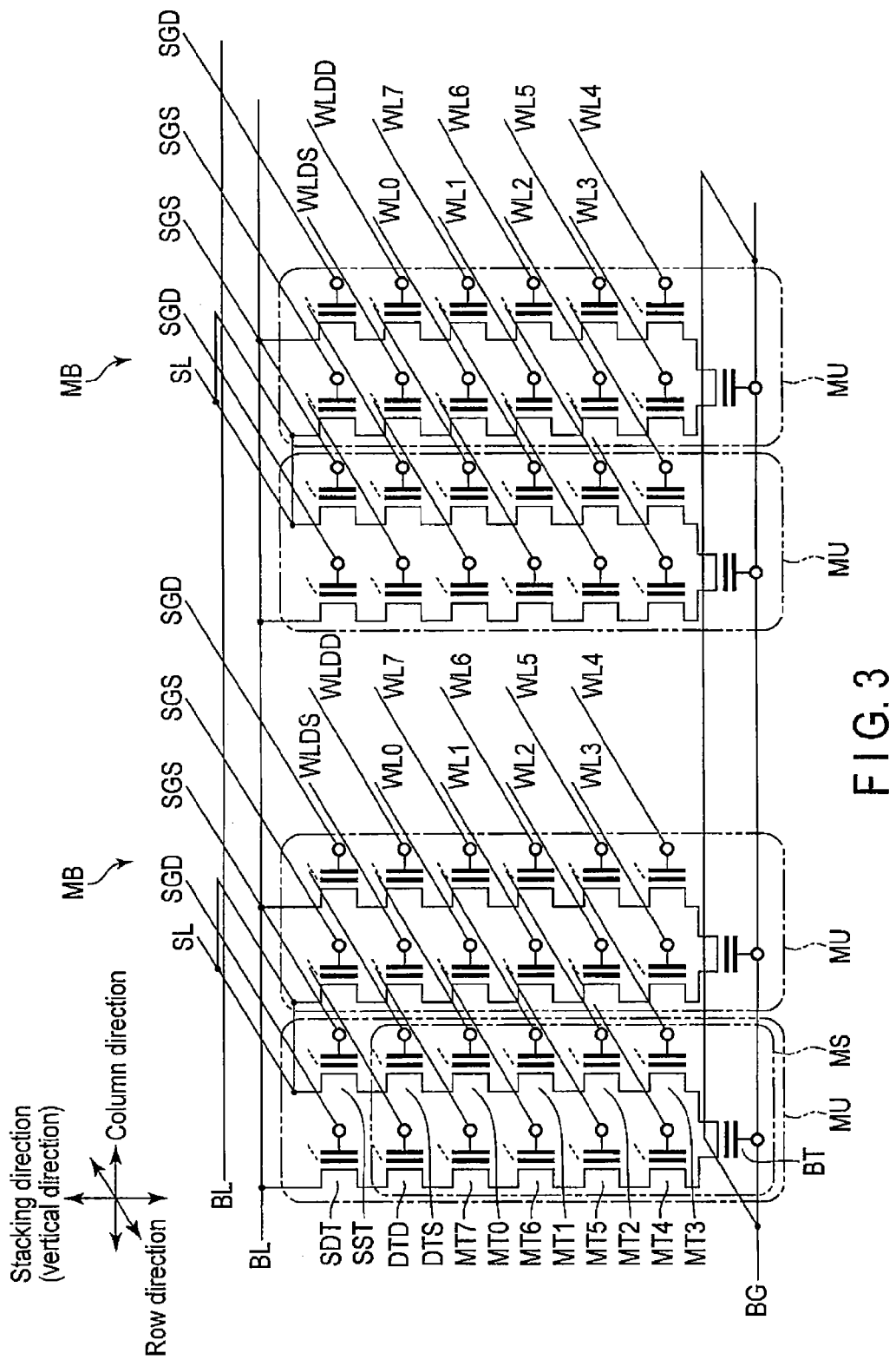
FIG. 3 is a circuit diagram of a part of the memory cell array.

In general, according to one embodiment, there is provided a semiconductor memory device comprising:

memory units each of which includes first and second select transistors and memory cells connected in series between the first and second select transistors;

first and second select gate lines connected to gates of the first and second select transistors, respectively;

word lines connected to gates of the memory cells, respectively;

a bit line connected to the first select transistor;

a source line connected to the second select transistor; and a control circuit configured to perform voltage control of the memory units, wherein the control circuit applies a first potential difference between a source and a drain of either the first or second select transistor in a first memory unit, thereby programming either the first or second select transistor, and applies a second potential difference lower than the first potential difference between a source and a drain of either the first or second select transistor in a second memory unit connected in common to the same select gate line as that of the first memory unit, thereby inhibiting either the first or second select transistor from being programmed.

Embodiments will be explained below with reference to the accompanying drawings. Note that these drawings are exemplary or conceptual, so the dimensions and ratios of each drawing are not necessarily the same as real dimensions and ratios. Several embodiments to be described below represent examples of apparatuses and methods for embodying the technical idea of the present invention, and the technical idea of the present invention is not specified by the shapes, structures, and layouts of the constituent parts. Note that in the following explanation, the same reference numerals denote elements having the same functions and arrangements, and a repetitive explanation will be made only when necessary.

First Embodiment

1. Configuration of Semiconductor Memory Device

FIG. 1 is a block diagram of a semiconductor memory device according to a first embodiment. In FIG. 1 and any other figure, the division of functional blocks as shown in the figures is not essential. For example, a part of the functions may be executed by a functional block different from a functional block illustrated in an explanation below. In addition, an illustrated functional block may be further divided into sub-functional blocks.

The semiconductor memory device 10 comprises a stacked NAND flash memory where a plurality of memory cells are arranged three-dimensionally. As shown in FIG. 1, the semiconductor memory device 10 comprises a memory cell array 1, row decoder 2, sense circuit 3, column decoder 4, control circuit 5, input/output circuit 6, address/command register 7, voltage generator 8, and core driver 9. The memory cell array 1 includes a plurality of blocks (memory blocks). Each block includes a plurality of memory cells (memory cell transistors), a plurality of word lines WLs, and a plurality of bit lines BLs. Specific memory cells or the corresponding memory space constitute a page. Data is read or written for each page and data is erased for each block. The details of the memory cell array 1 will be described later.

The row decoder 2 includes a transfer gate 2a and a cell source line control circuit 2b. The row decoder 2 receives a block address signal and the like from the address/command register 7 and receives a word line control signal and a select gate control signal from the core driver 9. The row decoder 2 selects a specific block and a specific word line WL on the basis of the received block address signal, word line control signal, and select gate control signal. The row decoder 2 may be provided on both sides of the memory cell array 1.

The sense circuit 3 reads data from the memory cell array 1 and stores the read data temporarily. The sense circuit 3 receives write data from outside the semiconductor memory device 10 and writes the received data to the selected memory cell. The sense circuit 3 includes a plurality of sense modules (sense amplifier modules) 3a. The sense modules 3a are connected to a plurality of bit lines in a one-to-one correspondence and each amplify the voltage of the corresponding bit line. The column decoder 4 receives a column address signal from the address/command register 7 and decodes the received column address signal. The column decoder 4 controls the input and output of data to and from the sense circuit 3 on the basis of the decoded address signal.

The control circuit 5 receives a command to perform reading, writing, erasing, or the like from the address/command register 7. On the basis of the command, the control circuit 5 controls the voltage generator 8 and core driver 9 according to a specific sequence. Under the control of the control circuit 5, the voltage generator 8 generates all voltages which are necessary for a core operation and which are referred to and described later in this specification. Under the control of the control circuit 5, the core driver 9 controls the row decoder 2 and sense circuit 3 to control word lines WLs and bit lines BLs. The input/output circuit 6 controls the input and output of commands, addresses, and data from and to outside the semiconductor memory device 10. The control circuit 5 performs operations (including a write operation) shown in operations and embodiments described below by controlling the core driver 9, row decoder 2, sense circuit 3, and column decoder 4.

The memory cell array 1 has a structure shown in FIGS. 2 and 3. FIG. 2 is a perspective view of a part of the memory cell array 1. FIG. 3 is a circuit diagram of a part of the memory cell array 1.

The memory cell array 1 comprises memory cell transistors MTs that electrically store data and are arranged in a matrix three-dimensionally. That is, the memory cell transistors MTs are not only arranged in a matrix horizontally but also arranged in a matrix in a stacking direction (in a direction perpendicular to the substrate).

As shown in FIGS. 2 and 3, the memory cell array 1 includes a plurality of bit lines BLs, a plurality of source lines SLs, and a plurality of memory blocks (block) MBs. The source lines SLs extend in a row direction. The bit lines extend in a column direction. The column direction is at right angles to the row direction. The blocks MBs are arranged side by side with a specific pitch in the column direction. A block includes a plurality of memory units MUs arranged in a matrix in the row and column directions. In a block MB, a plurality of memory units MUs are connected to a bit line BL.

Each memory unit MU includes a memory string MS, a drain-side select transistor SDT, and a source-side select transistor SST. The memory string MS includes, for example, eight memory cell transistors MTs (MT0 to MT7) and a back gate transistor BT. Each memory cell transistor MT includes a stacked gate which includes a control gate and a charge storage layer and which stores data in a nonvolatile manner. The number of memory cell transistors MTs included in each memory unit MU is not limited to 8 and may be 16, 32, 64, 128, or the like and can be set arbitrarily. Like the memory cell transistor MT, the back gate transistor BT includes a stacked gate that includes a control gate and a charge storage layer. The back gate transistor BT is not for storing data and is turned on in writing or reading data.

The memory cell transistors MTs and back gate transistor BT are arranged between select transistors SDT and STT in such a manner that their current paths are connected in series. The back gate transistor BT is provided between memory cell transistors MT3 and MT4.

In the first embodiment, a dummy transistor DTD is provided between select transistor SDT and memory cell transistor MT7 in each memory unit MU in such a manner that its current path is connected in series. In addition, a dummy transistor DTS is provided between select transistor SST and memory cell transistor MT0 in such a manner that its current path is connected in series. Each of dummy transistors DTD and DTS has the same configuration as that of the memory cell transistor MT, but is not used to store data and is turned on in writing or reading data. The number of dummy transistors DTDs is not restricted to one and may be two or more. The same holds true for dummy transistor DTS. Alternatively, as described later, neither dummy transistor DTD nor DTS is provided and memory cells adjacent to select transistors SDT and SST may be used as dummy transistors.

Select transistors SDT and SST are located above dummy transistors DTD and DTS in the stacking direction, respectively. The source of select transistor SDT is connected to one end of a memory string MS (the drain of dummy transistor DTS). The drain of select transistor SST is connected to the other end of the memory string MS (the source of dummy transistor DTS). One end of the current path of select transistor SDT is connected to a bit line BL. One end of the current path of select transistor SST is connected to a source line SL.

The control gate of each memory cell transistor MT0 of a plurality of memory units MUs arranged in the row direction of a block MB is connected to word line WL0 in a common connection manner. Similarly, the control gates of memory cell transistors MT1 to MT7 of a plurality of memory units MUs arranged in the row direction of a block MB are connected to word lines WL1 to WL7 respectively in a common connection manner. The control gates of dummy transistors DTD and DTS of a plurality of memory units MUs arranged in the row direction of a block MB are connected to dummy word lines WLDD and WLDS, respectively in a common connection manner. The word lines WLs, and dummy word lines WLDD and WLDS extend in the row direction. The gates of the back gate transistors BTs are connected to a back gate line BG in a common connection manner.

The gate of each drain-side select transistor SDT of a plurality of memory units MUs arranged in the row direction in a block MB is connected to a drain-side select gate line SDG in a common connection manner. Select gate line SGD extends in the row direction. The drains of select transistors SDTs of a plurality of memory units MUs arranged in the column direction are connected to a bit line BL in a common connection manner. That is, the bit line BL connects a plurality of memory units MUs arranged in the column direction between blocks MBs in a common connection manner.

The gate of each source-side select transistor SST of a plurality of memory units MUs arranged in the row direction in a block MB is connected to a source-side select gate line SGS in a common connection manner. The sources of select transistors SSTs of two memory units MUs arranged in the column direction are connected to the same source line SL. The source of each select transistor SST of a plurality of memory units MUs arranged in the row direction in a block MB is connected to the same source line SL. The source line SL connects memory units MUs between, for example, blocks MBs in a common connection manner. Select gate lines SGD and SGS, and source line SL extend in the row direction.

That is, word lines WL0 to WL7, back gate line BG, and dummy word lines WLDD and WLDS are connected in a common connection manner in the same block MB, whereas select gate lines SGD and SGS are independent in units of the memory cell units MUs arranged in the row direction even in the same block MB.

Data in the memory cell transistors MTs in the same block MB is erased collectively. In contrast, data is read or written collectively from or to the ones arranged in the row direction of all the memory cell transistors MTs connected to a word line WL in a block MB (the memory cell transistors MTs selected by a pair of select gate lines SGS and SGS). This unit is called "a page."

Next, a sectional structure of the memory cell array 1 will be explained. FIG. 4 is a sectional view of the memory cell array 1.

The memory cell array 1 comprises a back gate transistor layer L1, a memory cell transistor layer L2, a select transistor layer L3, and an interconnection layer L4 stacked one on top of another in that order via an insulating layer (not shown) on a semiconductor substrate 20. The back gate transistor layer L1 functions as a back gate transistor BT. The memory cell transistor layer L2 functions as memory cell transistors MT0 to MT7 and dummy transistors DTD and DTS. The select transistor layer L3 functions as select transistors SDT and SST. The interconnection layer L4 functions as source lines SL and bit lines BL.

The back gate transistor layer L1 includes a back gate conducting layer 21 functioning as a back gate line BG. The back gate conducting layer 21 is formed so as to expand two-dimensionally in the row and column directions parallel to the semiconductor substrate 20. The back gate conducting layer 21 is divided on a block MB basis. The back gate conducting layer 21 is made of, for example, conductive polycrystalline silicon. In addition, the back gate conducting layer 21 has a back gate hole 22 in it. The back gate hole 22 is made so as to dig in the back gate conducting layer 21. The back gate hole 22 is made so as to be almost rectangular, with the column direction corresponding to the longitudinal direction when viewed from above.

The memory cell transistor layer L2 includes word line conducting layers 23a to 23d and a dummy word line 23e. Conducting layers 23a to 23e are stacked with an interlayer insulating layer (not shown) between them. Conducting layers 23a to 23e are formed with a specific pitch in the column direction so as to be each shaped like a stripe extending in the row direction. Conducting layers 23a to 23e are made of, for example, conductive polycrystalline silicon. Conducting layer 23a functions as the control gates of memory cell transistors MT3 and MT4 (word lines WL3 and WL4). Conducting layer 23b functions as the control gates of memory cell transistors MT2 and MT5 (word lines WL2 and WL5). Conducting layer 23c functions as the control gates of memory cell transistors MT1 and MT6 (word lines WL1 and WL6). Conducting layer 23d functions as the control gates of memory cell transistors MT0 and MT7 (word lines WL0 and WL7). Conducting layer 23e functions as the control gates of dummy transistors DTD and STS (dummy word lines WLDD and WLDS).

The memory cell transistor layer L2 has a memory hole 24. The memory hole 24 is made so as to pass through conducting layers 23a to 23e. The memory hole 24 is formed so as to align with one end of the back gate hole 22 in the column direction.

The select transistor layer L3 includes conducting layers 27a and 27b. Conducting layers 27a and 27b are formed with a specific pitch in the column direction so as to be each shaped like a stripe extending in the row direction. A pair of conducting layers 27a and a pair of conducting layers 27b are arranged alternately in the column direction. Conducting layers 27a and 27b are made of, for example, conductive polycrystalline silicon. Conducting layer 27a functions as the gate (select gate line SGS) of select transistor SST. Conducting layer 27b functions as the gate (select gate line SGD) of select transistor SDT.

The select transistor layer L3 has holes 28a and 28b in it. Holes 28a and 28b pass through conducting layers 27a and 27b, respectively. Each of holes 28a and 28b aligns with the memory hole 24.

The back gate transistor layer L1, memory cell transistor layer L2, and select transistor layer L3 include a block insulating layer 25a, a charge storage layer 25b, a tunnel insulating layer 25c, and a semiconductor layer 26. The semiconductor layer 26 functions as a body (channel formation part) of a memory unit MU.

The block insulating layer 25a is formed on a sidewall facing the back gate hole 22, memory hole 24, and holes 28a and 28b so as to have a specific thickness. The charge storage layer 25b is formed on a side surface of the block insulating layer 25a so as to have a specific thickness. The tunnel insulating layer 25c is formed on a side surface of the charge storage layer 25b so as to have a specific thickness. The semiconductor layer 26 is formed so as to contact a side surface of the tunnel insulating layer 25c. The semiconductor layer 26 is formed so as to fill up the back gate hole 22, memory hole 24, and holes 28a and 28b.

The semiconductor layer 26 is formed into a U shape when viewed from the row direction. That is, the semiconductor layer 26 includes a pair of pillar parts 26a extending in a direction perpendicular to the surface of the semiconductor substrate 20 and a connecting part 26b that connects the lower ends of the pair of pillar parts 26a.

The block insulating layer 25a and the tunnel insulating layer 25c are made of, for example, oxide silicon ($SiO_2$). The charge storage layer 25b is made of, for example, silicon nitride (SiN). The semiconductor layer 26 is made of, for example, polycrystalline silicon. The block insulating layer 25a, charge storage layer 25b, tunnel insulating layer 25c, and semiconductor layer 26 constitute a MONOS transistor that functions as the memory transistor MT, dummy transistors DTD and DTS, and select transistor SDT and SST.

In other words, the configuration of the back gate transistor layer L1 is such that the tunnel insulating layer 25c is formed so as to enclose the connecting part 26b. The charge storage layer 25b is formed so as to enclose the tunnel insulating layer 25c. The block insulating layer 25a is formed so as to enclose the charge storage layer 25b. The back gate conducting layer 21 is formed so as to enclose the block conducting layer 25a.

The configuration of the memory transistor layer L2 and select transistor layer L3 is so paraphrased that the tunnel insulating layer 25c is formed so as to enclose the pillar part 26a. The charge storage layer 25b is formed so as to enclose the tunnel insulating layer 25c. The block storage insulating layer 25a is formed so as to enclose the charge storage layer 25b. The word line conducting layers 23a to 23d and conducting layers 27a and 27b are formed so as to enclose the block insulating layer 25a.

The interconnection layer L4 is formed in a layer above the select transistor layer L3. The interconnection layer L4 includes a source line layer 31, a plug layer 32, and a bit line layer 33. The source line layer 31 is formed into a plate extending in the row direction. The source line layer 31 is formed so as to contact the top surface of one semiconductor layer 26a. The plug layer 32 is formed so as to contact the top surface of the other semiconductor layer 26a and extend in a direction perpendicular to the surface of the semiconductor substrate 20. The bit line layers 33 are formed into stripes extending in the column direction with a specific pitch in the row direction. The bit line layer 33 is formed so as to contact the top surface of the plug layer 32. The source line layer 31, plug layer 32, and bit line layer 33 are made of metal, such as tungsten (W) or the like. The source line layer 31 functions as the source line SL and the bit line layer 33 functions as the bit line BL.

2. Operation

Figure 5:
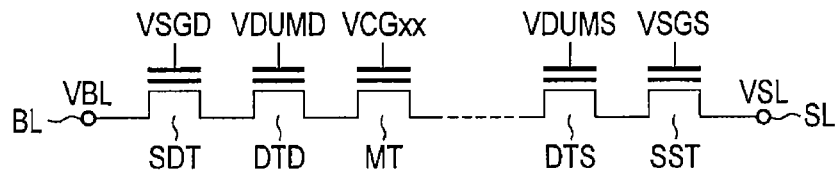
FIG. 5 is a circuit diagram of a memory cell unit.

First, a voltage applied to a memory unit MU will be defined. FIG. 5 is a circuit diagram of a memory unit MU. As described above, in a memory unit MU, a drain-side select transistor SDT, a drain-side dummy transistor DTD, memory cell transistors MT0 to MT3, a back gate transistor BT, memory cell transistors MT4 to MT7, a source-side dummy transistor DTS, and a source-side select transistor SST arranged in that order between a bit line BL and a source line SL in such a manner that their current paths are connected in series. In FIG. 5, one of memory cell transistors MT0 to MT7 is extracted and the back gate transistor BT is not shown.

As shown in FIG. 5, VBL indicates a bit line voltage, VSGD the gate voltage of select transistor SDT, VDUMD the control gate voltage of dummy transistor DTD, VCGxx the control gate voltage of a memory cell transistor MT, VDUMS the control gate voltage of dummy transistor DTS, VSGS the gate voltage of select transistor SST, and VSL a source line voltage. The bit line voltage VBL is controlled by using a bit line BL. The gate voltages VSGD, VSGS are controlled by using select gate lines SGD, SGS, respectively. The control gate voltages VDUMD, VDUMS are controlled by using dummy word lines WLDD and WLDS, respectively. The control gate voltage VCGxx is controlled by using a word line WL. The source line voltage VSL is controlled by using a source line SL.

[2-1. Threshold Adjustment of Drain-Side Select Transistor SDT]

Figure 6:
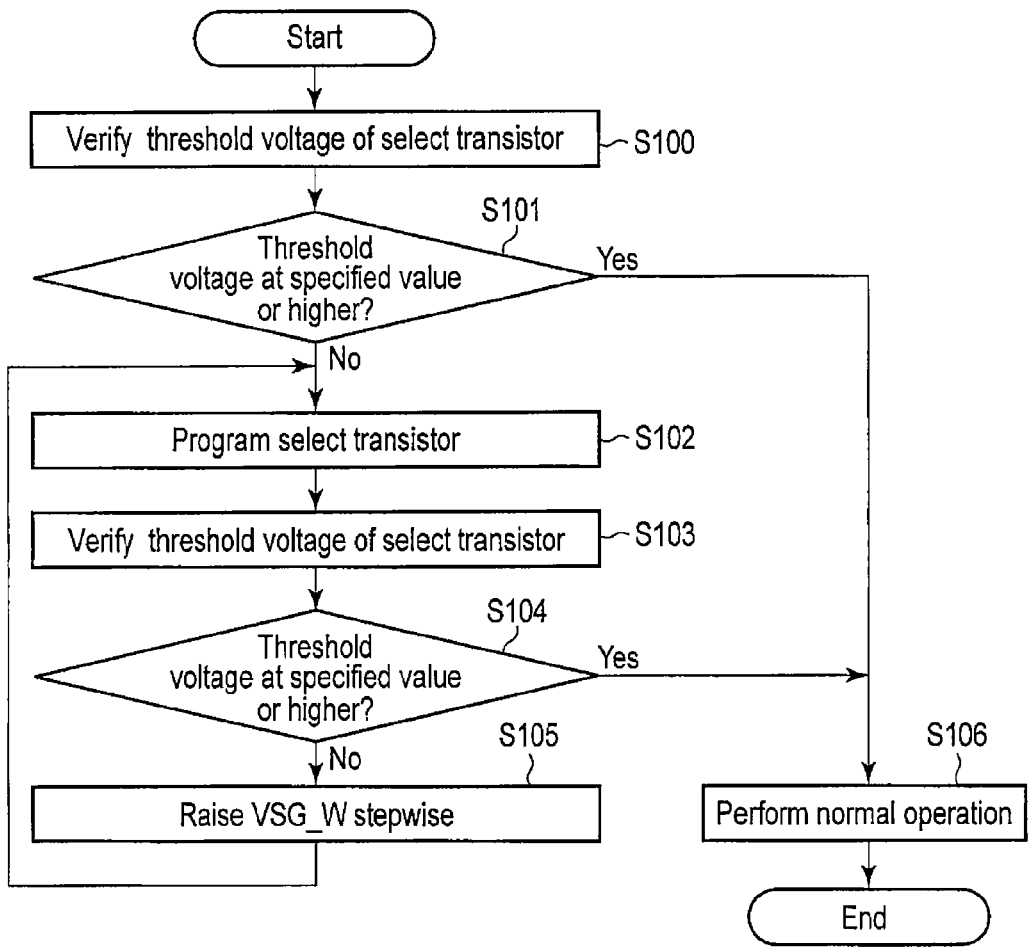
FIG. 6 is a flowchart to explain the operation of adjusting the threshold of a select transistor.

First, the threshold adjustment of the drain-side select transistor SDT will be explained. FIG. 6 is a flowchart to explain the operation of adjusting the threshold of the select transistor by the control circuit 5.

First, the threshold voltage of the select transistor is verified (step S100). In a verify operation of the select transistor, a specific VBL (for example, 0.5 V) is applied to the bit line BL, VSL is set to VSS (0 V), the gate voltages excluding VSGD in a block MB including a select transistor to be verified (in this case, drain-side select transistor SDT) are set to Vread (for example, 5 V), and VSGD is set to Vth_target (for example, 1V). Vread is a voltage that can turn on a memory cell transistor MT, regardless of data stored in the memory cell transistor MT. At this time, a current passing through the memory cell unit MU is sensed, making it possible to determine whether the threshold voltage of select transistor SDT connected to common select gate line SGD is at Vth_target or higher (step S101). That is, since all the transistors to which Vread has been applied are on, the threshold voltage of select transistor SDT can be determined, depending on whether the bit line BL is discharged.

Figure 7:
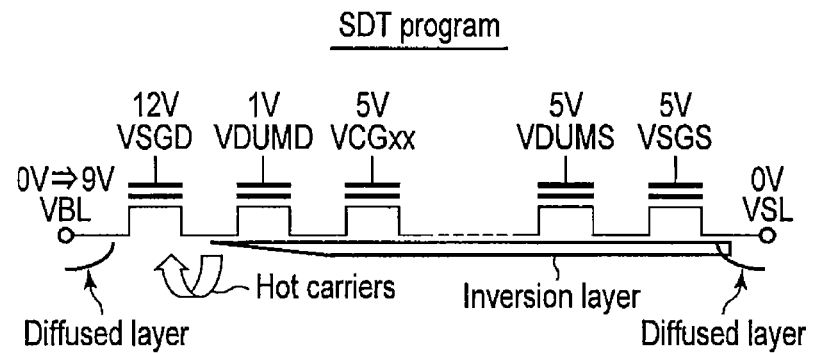
FIG. 7 is a diagram to explain a program operation of a drain-side select transistor.

Then, when the threshold voltage of select transistor SDT is lower than Vth_target, the control circuit 5 adjusts the threshold voltage of select transistor SDT, that is, writes to (programs) select transistor SDT, in a memory unit (selected memory unit) including select transistor SDT (step S102). FIG. 7 is a diagram to explain a voltage to be applied to the selected memory unit in programming drain-side select transistor SDT. As shown in FIG. 7, the control circuit 5 sets the selected memory unit as follows: VBL, VSL=Vss (0V), VSGD=VSG_W (for example, 12 V), VDUMD=VDUM_W (for example, 1 V), and VCGxx, VDUMS, and VSGS=Vread (5 V).

On the other hand, the control circuit controls an unselected memory unit not requiring the programming of select transistor SDT in such a manner that the threshold voltage of select transistor SDT does not rise. Therefore, in an unselected memory unit connected to a select gate line SGD differing from that of the selected one of the memory units included in the selected block (a block including the selected memory unit), the control circuit 5 gives VSGD=VSG_Wstby (3 V).

Then, the control circuit 5 raises VBL of a bit line BL connected to select transistor SDT to be programmed to VBL_W (for example, 9 V). As a result of the voltage control, an inversion layer (channel) in the selected memory unit is pinched off between the drain-side dummy transistor DTD and the drain-side select transistor SDT. Generated hot carriers (hot electrons) are captured in the charge storage layer of the high-potential drain-side select transistor SDT by high efficiency, causing the threshold voltage of select transistor SDT to rise.

Figure 8:
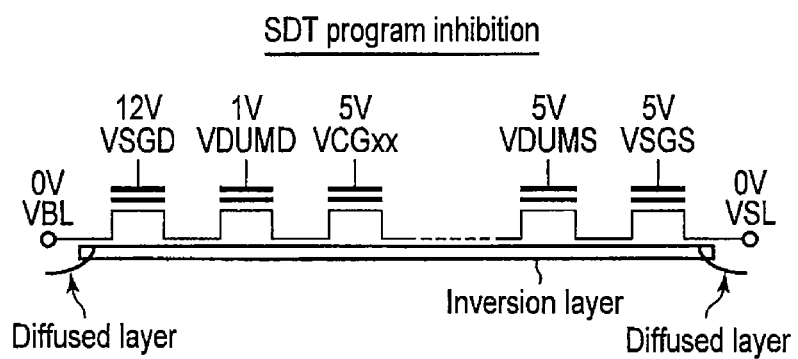
FIG. 8 is a diagram to explain the operation of inhibiting the drain-side select transistor from being programmed.

In the meantime, the same gate voltage as that of the selected memory unit is applied also to the unselected memory unit connected in a common connection manner to select gate line SGD connected to the selected memory unit. FIG. 8 is a diagram to explain a voltage applied to the unselected memory unit connected in a common connection manner to select gate line SGD connected to the selected memory unit. VBL of the bit line BL connected to the unselected memory cell unit remains at Vss (0 V).

Select transistor SDT included in the unselected memory unit has a threshold voltage greater than or equal to Vth_target. As for select transistor SDT that already has a sufficiently high threshold voltage, although an inversion layer is formed all over the semiconductor layer of the unselected memory unit including select transistor SDT, an electric field corresponding to each gate voltage is applied between the channel and gate because conditions for generating hot carriers are not satisfied. However, such a high electric field as causes sufficient FN tunneling to take place is not obtained, with the result that charges are hardly injected into the charge storage layer. Therefore, the threshold voltage of select transistor SDT hardly changes, preventing erroneous writing.

When the threshold voltage of select transistor SDT has been verified (steps S103 and S104) and the threshold voltage has not reached Vth_target yet after select transistor SDT has been programmed, the programming is further executed. At this time, to satisfy conditions for making it easier to generate hot carriers, it is desirable that VSG_W should be raised stepwise each time the number of times programming is done increases (step S105). Alternatively, VDUM_W may be decreased stepwise or VBL_W be increased stepwise. Then, a loop composed of a verify operation and a program operation is repeated so that the threshold voltages of all select transistors SDTs may become greater than or equal to Vth_target.

When the threshold adjustment of all select transistors SDTs included in the memory cell array has been completed, the control circuit 5 performs a normal operation (such as a write operation or an erase operation) from this point on (step S106).

FIG. 9 is a table to summarize the voltage relationship described above. FIG. 9 shows not only the voltage relationship (SDT program) in programming the drain-side select transistor SDT but also the voltage relationship (STT program) in programming the source-side select transistor SDT described later. An unselected MU of FIG. 9 corresponds to an unselected memory unit connected to a select gate line SGD differing from that of the selected one of the memory units included in the selected block (a block including the selected memory unit). "VBL for PROG" in FIG. 9 is VBL of a bit line connected to the selected memory unit and "VBL for INHIBIT" is VBL of a bit line connected to the unselected memory unit.

As for the unselected block, applying the voltages in FIG. 9 makes it possible to prevent select transistor SDT included in the unselected block from being programmed.

[2-2. Threshold Adjustment of Source-Side Select Transistor SST]

Next, the threshold adjustment of the source-side select transistor SST will be explained. A flowchart to explain a threshold adjustment operation is the same as that of FIG. 6. First, the threshold voltage of select transistor SST is verified (step S100). In a verify operation of select transistor SST, a specific VBL (for example, 0.5 V) is applied to the bit line BL, VSL is set to Vss (0 V), the gate voltages excluding VSGS in a block including a select transistor SST to be verified are set to Vread (for example, 5 V), and VSGS is set to Vth_target. At this time, a current passing through the memory cell unit MU is sensed, making it possible to determine whether the threshold voltage of select transistor SST connected to common select gate line SGS is at Vth_target or higher (step S101).

Then, when the threshold voltage of select transistor SST is lower than Vth_target, the control circuit 5 adjusts the threshold voltage of select transistor SST, that is, programs select transistor SST in a memory unit including select transistor SST (or the selected memory unit) (step S102). FIG. 10 is a diagram to explain a voltage to be applied to the selected memory unit in programming the source-side select transistor SST. As shown in FIG. 10, the control circuit 5 sets the selected memory unit as follows: VBL=VBL_W (for example, 9 V), VSL=VSL_W (for example, 9 V), VSGS=VSG_W (for example, 12 V), VDUMS=VDUM_W (for example, 1 V), and VCGxx, VDUMS, and VSGS=Vread (5 V).

On the other hand, the control circuit controls an unselected memory unit not requiring the programming of select transistor SST in such a manner that the threshold voltage of select transistor SST does not rise. Therefore, in an unselected memory unit connected to a select gate line SGS differing from that of the selected one of the memory units included in the selected block, the control circuit 5 gives VSGS=VSG_Wstby (3 V).

Then, the control circuit 5 raises VBL of a bit line BL connected to select transistor SST to be programmed to Vss (0 V). As a result of the voltage control, an inversion layer (channel) in the selected memory unit is pinched off between the source-side dummy transistor DTS and the source-side select transistor SST. Generated hot carriers (hot electrons) are captured in the charge storage layer of the high-potential source-side select transistor SST by high efficiency, causing the threshold voltage of select transistor SST to rise.

In the meantime, the same gate voltage as that of the selected memory unit is applied also to the unselected memory unit connected in a common connection manner to select gate line SGS connected to the selected memory unit. FIG. 11 is a diagram to explain a voltage applied to the unselected memory unit connected in a common connection manner to select gate line SGS connected to the selected memory unit. VBL of the bit line BL connected to the unselected memory cell unit remains at VBL_W (for example, 9 V).

Select transistor SST included in the unselected memory unit has a threshold voltage greater than or equal to Vth_target. As for select transistor SST that already has a sufficiently high threshold voltage, since conditions for generating hot carriers are not satisfied, the threshold voltage of select transistor SST hardly changes, preventing erroneous writing.

As with select transistor SDT, when the threshold voltage of select transistor SST has been verified (steps S103, S104) and the threshold voltage has not reached Vth_target yet after select transistor SST has been programmed, the programming is further executed. At this time, to satisfy conditions for making it easier to generate hot carriers, it is desirable that VSG_W should be raised stepwise each time the number of times programming is done increases (step S105). Alternatively, VDUM_W may be decreased stepwise or WSL_W be increased stepwise. Then, a loop composed of a verify operation and a program operation is repeated so that the threshold voltages of all select transistors SSTs may become greater than or equal to Vth_target.

3. Effects

As described above in detail, in the first embodiment, the control circuit 5 adjusts (programs) the threshold voltage of select transistor SDT by using hot carriers generated as a result of applying a first potential difference between the source and drain of select transistor SDT included in the selected memory unit to be programmed. In addition, the control circuit 5 inhibits select transistor SDT from being programmed by making a second potential difference between the source and drain of select transistor SDT included in an unselected memory unit connected in a common connection manner to the same select gate lines SGD and SGS as that of the selected memory unit lower than the first potential difference. The threshold voltage of select transistor SST is adjusted in the same manner as select transistor SDT.

Therefore, with the first embodiment, select transistors SDT and SST provided at the ends of a memory unit MU can be selectively programmed, enabling the threshold voltages of select transistors SDT and SST to be controlled into a state where the threshold voltages are positive and vary in a low level. This makes it possible to optimize the threshold voltages of select transistors SDT and SST and realize the high-speed and high-reliability of semiconductor memory device 10.

In addition, when select transistor SDT (or SST) is programmed, there is no need to provide an additional transistor for cutting off the channel of a memory unit between select transistor SDT (or SST) and a bit line BL (or a source line SL). This makes it possible to realize the programming of select transistors SDT and SST without increasing the process cost.

Second Embodiment

In the first embodiment, a select transistor has been programmed while a high voltage (9 V) has been being applied to a bit line BL, and 0 to 9 V have been selectively applied to a plurality of bit lines BLs in a program operation. To apply a voltage in the range of 0 to 9 V to each bit line BL, it is necessary to provide a high-voltage transistor for each bit line BL.

Between a bit line BL and a sense circuit 3 (composed of a low-voltage transistor), there is provided a high-voltage transistor for electrically separating the bit line BL and the sense circuit 3 when the bit line BL has been raised to an erase voltage Verase in an erase operation. The high-voltage transistor switches a connection between all the bit lines and the sense circuit 3 at the same time. In the second embodiment, use of the high-voltage transistor connected to a bit line BL enables a voltage (0 to 9 V) necessary for threshold adjustment of the select transistor to be applied to each bit line BL, making use of the transistor configuration of the present core circuit.

Although only an operation related to the threshold adjustment of the select transistor will be explained below, the operation of verifying the threshold voltage of the select transistor is the same as in the first embodiment.

[1. Threshold Adjustment of Drain-Side Select Transistor SDT]

First, the threshold adjustment (program) of the drain-side select transistor SDT will be explained. In the initial setting, the control circuit 5 sets all the word lines WLs and all dummy word lines WLDD and WLDS to 0 V. In addition, the control circuit 5 sets select gate lines SGSs of the selected block and unselected blocks to 0 V and a source line SL to 0 V.

Then, the control circuit 5 programs select transistor SDT. FIG. 12 is a diagram to explain a first step of the program operation of the drain-side select transistor SDT. FIG. 12(*a*) shows a plurality of memory units connected to the selected bit line BL to which the selected memory unit including a select transistor to be programmed is connected. FIG. 12(*b*) shows a plurality of memory units (inhibited from being programmed) connected to an unselected bit line. As shown in FIG. 12(*a*), to the selected bit line BL, the selected memory unit and an unselected memory unit both included in the selected block and an unselected memory unit included in an unselected block are connected. From a comparison between FIG. 12(*a*) and FIG. 12(*b*), it is seen that the memory units in the same column are connected to the same select gate line.

The control circuit 5 applies VSG_W (for example, 12 V) to selected select gate line SGD in the selected block and VSG_Wstby (for example, 3 V) to an unselected select gate line SGD. In addition, the control circuit 5 applies a power supply voltage Vdd (for example, 3 V) to SGD in an unselected block. Then, the control circuit 5 applies Vdd to the selected bit line BL and Vss (0 V) to an unselected bit line BL, with the high-voltage transistor HV connected to the bit line BL being on. At this time, a memory unit in the unselected block to be connected to the selected bit line BL is electrically disconnected from the bit line BL and goes into a floating state. The high-voltage transistor HV is composed of, for example, an n-channel MOSFET. The high-voltage transistor HV is provided for each bit line BL and included in the sense module 3*a* of FIG. 1. Controlling the gate voltage of the high-voltage transistor HV makes it possible to control an electric connection between the bit line BL and sense circuit 3 (a circuit part for controlling the voltage of the bit line BL).

Then, the control circuit 5 applies 5 V to a word line WL and a dummy word line WLDS in the selected block and 1 V to a dummy word line WLDD. In addition, the control circuit 5 applies 10 V to the word lines WLs and dummy word lines WLDD and WLDS in an unselected block. At this time, the body potential of a memory unit in the unselected block to be connected to the selected bit line BL is raised to about 10 V as a result of coupling with a word line WL. On the other hand, the body potential of a memory unit in an unselected block to be connected to an unselected bit line BL is maintained at 0 V by way of the unselected bit line BL.

Figure 13:
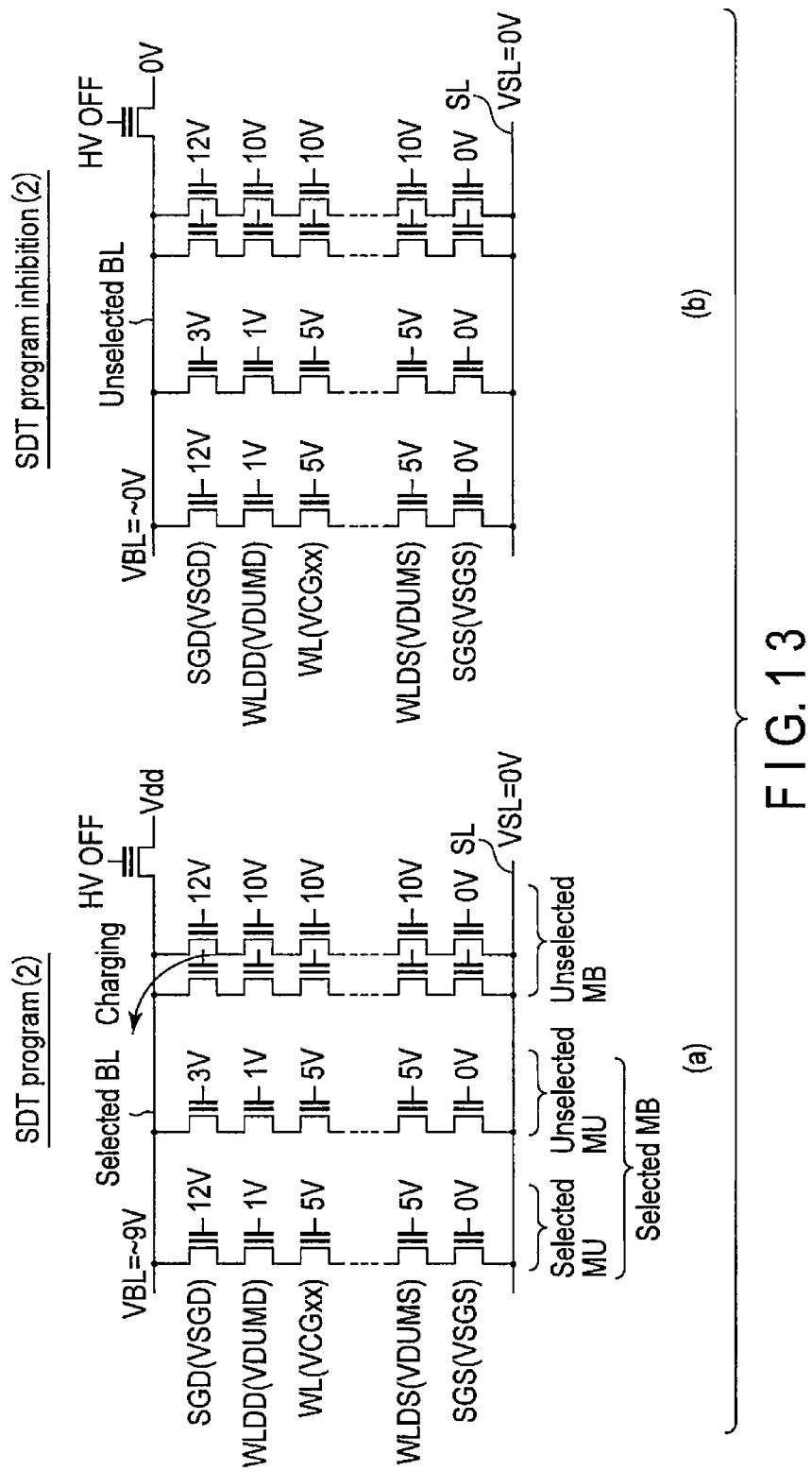
FIG. 13 is a diagram to explain a second step of the program operation of the drain-side select transistor.

FIG. 13 is a diagram to explain a second step of the program operation of the drain-side select transistor SDT. The control circuit 5 turns off the high-voltage transistor HV. Then, the control circuit 5 applies a sufficient voltage to transfer the raised body potential, for example, 12 V, to select gate line SGD in an unselected block. As a result, the body potential of the memory unit of each of many unselected blocks is divided for each bit line BL (bit line capacitance), with the result that the selected bit line BL is at about 9 V and an unselected bit line BL is at 0 V. As described above, only using the high-voltage transistor HV on a bit line BL enables 0 to 9 V to be selectively applied to each bit line BL.

FIG. 14 is a diagram to explain a third step of the program operation of the drain-side select transistor SDT. The control circuit 5 applies 5 V only to selected select gate line SGS (connected to the selected memory unit). As a result, in the selected memory unit, the inversion layer (channel) of the selected memory unit is pinched off between the drain-side dummy transistor DTD and the drain-side select transistor SDT. The generated hot carriers (hot electrons) are captured in the charge storage layer of the high-potential drain-side select transistor SDT by high efficiency, causing the threshold voltage of select transistor SDT to rise. On the other hand, in an unselected memory cell unit, select transistor SDT is inhibited from being programmed because conditions for producing hot carriers are not satisfied.

As described above, use of the high-voltage transistor HV connected to a bit line BL enables 0 to 9 V to be selectively applied to each bit line BL. Therefore, the writing method can be realized without increasing the core circuit area.

In addition, the memory unit capacitances of many unselected blocks are connected to a bit line BL and therefore programming can be performed using charge stored in a large capacitance. This makes it possible to obtain a stable writing characteristic with a small fluctuation in the bit line BL potential in writing hot carriers.

[2. Threshold Adjustment of Source-Side Select Transistor SST]

Next, the threshold adjustment (program) of the source-side select transistor SST will be explained. In the initial setting, the control circuit 5 sets all the word lines WLs and all dummy word lines WLDD and WLDS to 0 V. In addition, the control circuit 5 sets select gate lines SGSs of the selected block and unselected blocks to 0 V and a source line SL to 0 V.

Then, the control circuit 5 programs select transistor SST. FIG. 15 is a diagram to explain a first step of the program operation of the source-side select transistor SST. FIG. 15(a) shows a plurality of memory units connected to the selected bit line to which the selected memory unit including a select transistor to be programmed is connected. FIG. 15(b) shows a plurality of memory units (inhibited from being programmed) connected to an unselected bit line.

The control circuit 5 applies 5 V to selected select gate line SGD in the selected block. In addition, the control circuit 5 applies Vdd to select gate line SGD in an unselected block. Then, the control circuit 5 applies 0 V to the selected bit line BL and Vdd to an unselected bit line BL, with the high-voltage transistor HV connected to the bit line BL being on. At this time, a memory unit in the unselected block to be connected to the unselected bit line BL is electrically disconnected from the bit line BL and goes into a floating state.

Then, the control circuit 5 applies 5 V to the word lines WLs and dummy word line WLDD in the selected block and 1 V to dummy word line WLDS. In addition, the control circuit 5 applies 10 V to the word lines WLs and dummy word lines WLDD and WLDS in an unselected block. At this time, the body potential of a memory unit in the unselected block to be connected to the unselected bit line BL is raised to about 9 V as a result of coupling with a word line WL. On the other hand, the body potential of a memory unit in an unselected block to be connected to the selected bit line BL is maintained at 0 V by way of the selected bit line BL.

FIG. 16 is a diagram to explain a second step of the program operation of select transistor SST. The control circuit 5 turns off the high-voltage transistor HV. Then, the control circuit 5 applies a sufficient voltage to transfer the raised body potential, for example, 12 V, to select gate line SGD in an unselected block. As a result, the body potential of the memory unit included in each of many unselected blocks is divided for each bit line BL (bit line capacitance), with the result that the selected bit line BL is at about 0 V and an unselected bit line BL is at 9 V. As described above, only using the high-voltage transistor HV on a bit line BL enables 0 to 9 V to be selectively applied to each bit line BL.

Figure 17:
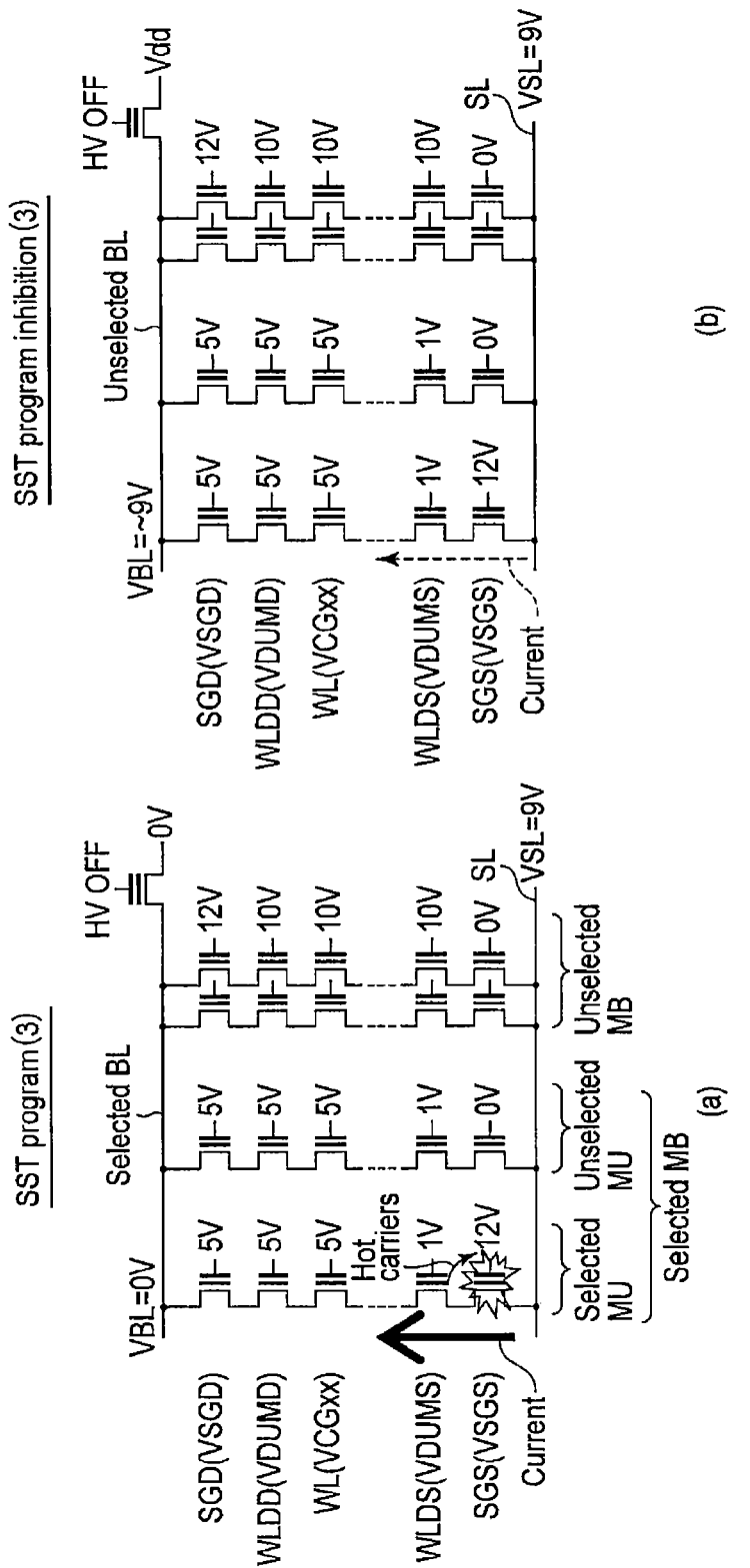
FIG. 17 is a diagram to explain a third step of the program operation of the source-side select transistor.

FIG. 17 is a diagram to explain a third step of the program operation of select transistor SST. The control circuit 5 applies 12 V only to selected select gate line SGS (connected to the selected memory unit). As a result, in the selected memory unit, the inversion layer (channel) of the selected memory unit is pinched off between the source-side dummy transistor DTS and the source-side select transistor SST. The generated hot carriers (hot electrons) are captured in the charge storage layer of the high-potential select transistor SST by high efficiency, causing the threshold voltage of select transistor SST to rise. On the other hand, in an unselected memory unit, select transistor SST is inhibited from being programmed because conditions for producing hot carriers are not satisfied.

As described above, use of the high-voltage transistor HV connected to a bit line BL enables 0 to 9 V to be selectively applied to each bit line BL. Therefore, the writing method can be realized without increasing the core circuit area.

Furthermore, when the high-voltage transistor is turned off, the gate voltage is set to an intermediate value, such as Vdd, not to 0 V, thereby producing a state where 0 V is transferred, but Vdd is not transferred. In this case, the unselected bit line BL is electrically disconnected from the sense circuit 3, maintaining 9 V. However, 0 V at the selected bit line BL is electrically connected to the sense circuit 3 in writing hot carriers, enabling 0 V to be stably maintained. This makes it possible to perform a more highly reliable program operation of select transistor SST.

Third Embodiment

A third embodiment is such that voltage control different from a program operation of the select transistor in the first embodiment is used and that the select transistor is programmed using FN tunnel current. Although only an operation related to the threshold adjustment of the select transistor will be explained, the operation of verifying the threshold voltage of the select transistor is the same as that in the first embodiment.

In the initial setting, the control circuit 5 sets all the word lines WLs and all dummy word lines WLDD and WLDS to 0 V. In addition, the control circuit 5 sets select gate lines SGSs of the selected block and unselected blocks to 0 V and a source line SL to 0 V.

Figure 18:
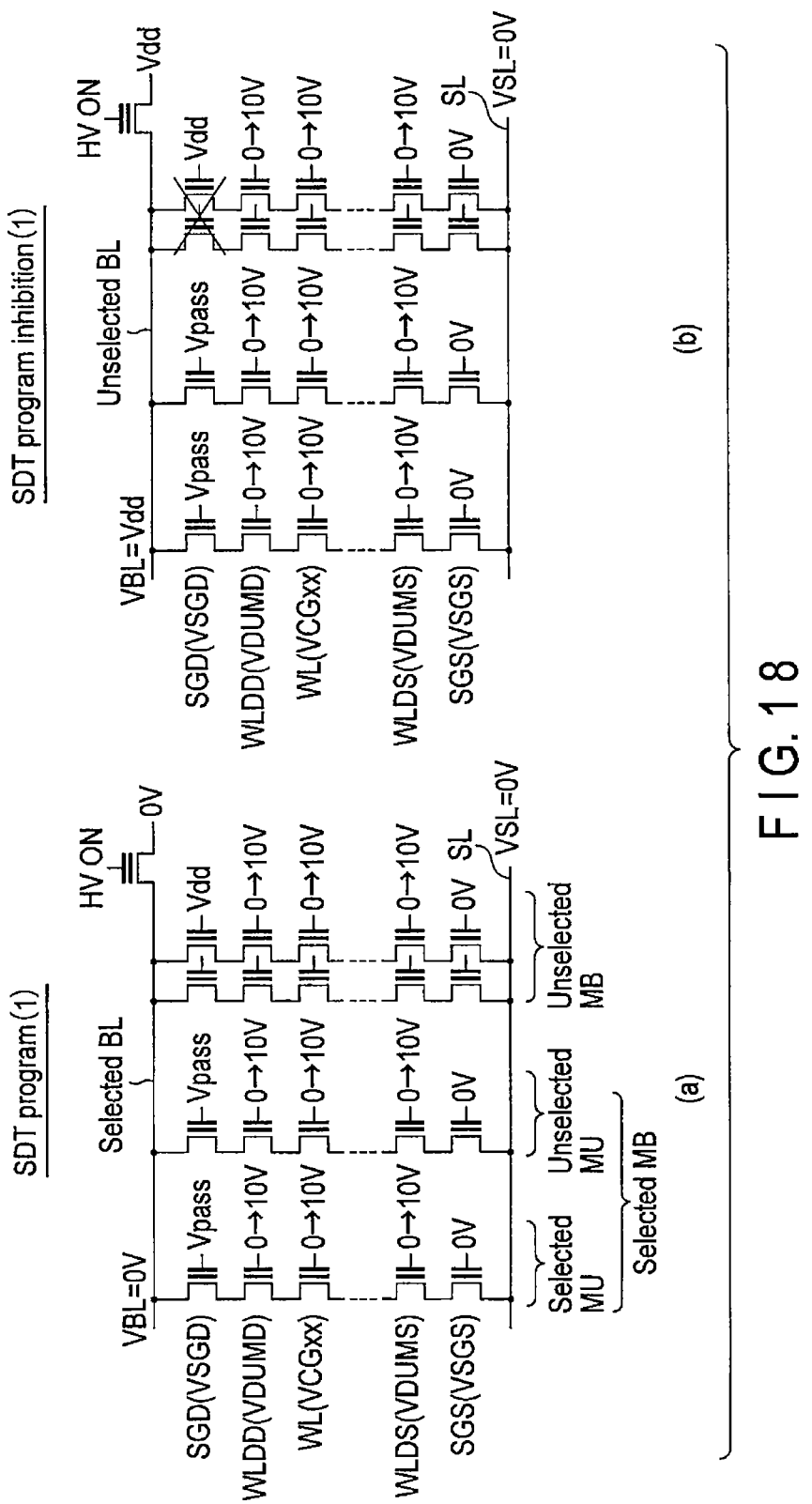
FIG. 18 is a diagram to explain a first step of a program operation of a drain-side select transistor according to a third embodiment.

Then, the control circuit 5 programs select transistor SDT. FIG. 18 is a diagram to explain a first step of the program operation of the drain-side select transistor SDT. FIG. 18(a) shows a plurality of memory units connected to the selected bit line to which the selected memory unit including a select transistor to be programmed is connected. FIG. 18(b) shows a plurality of memory units (inhibited from being programmed) connected to an unselected bit line.

The control circuit 5 applies Vpass (for example, 10 V) to all select gate lines SGDs in the selected block. Vpass is an unselected word line voltage in programming. Then, the control circuit 5 applies 0 V to the selected bit line BL and Vdd to an unselected bit line BL, with the high-voltage transistor HV connected to the bit line BL being on. At this time, a memory unit in the unselected block to be connected to the unselected bit line BL is electrically disconnected from the bit line BL and goes into a floating state.

Then, the control circuit 5 applies 10 V to the word lines WLs and dummy word lines WLDD and WLDS in the selected block and unselected block. At this time, the body potential of a memory unit in the unselected block to be connected to the unselected bit line BL is raised to about 10 V as a result of coupling with a word line WL. On the other hand, the body potential of a memory unit in an unselected block to be connected to the selected bit line BL is maintained at 0 V by way of the selected bit line BL.

Figure 19:
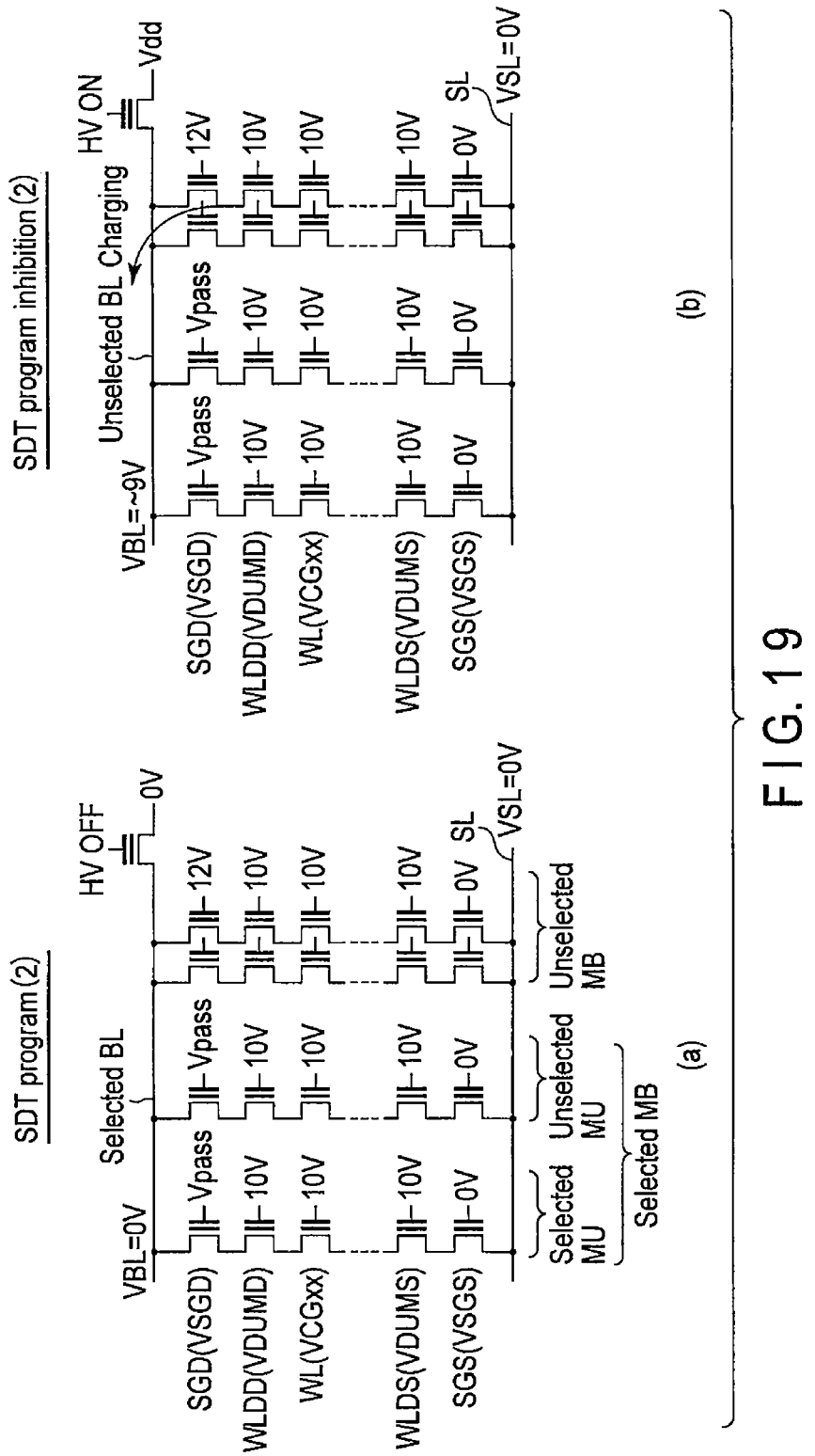
FIG. 19 is a diagram to explain a second step of the program operation of the drain-side select transistor.

FIG. 19 is a diagram to explain a second step of the program operation of the drain-side select transistor SDT. The control circuit 5 turns off the high-voltage transistor HV. Then, the control circuit 5 applies a sufficient voltage to transfer the raised body potential, for example, 12 V, to select gate line SGD in an unselected block. As a result, the body potential of the memory unit in each of many unselected blocks is divided for each bit line BL (bit line capacitance), with the result that the selected bit line BL is at about 0 V and an unselected bit line BL is at about 9 V.

Figure 20:
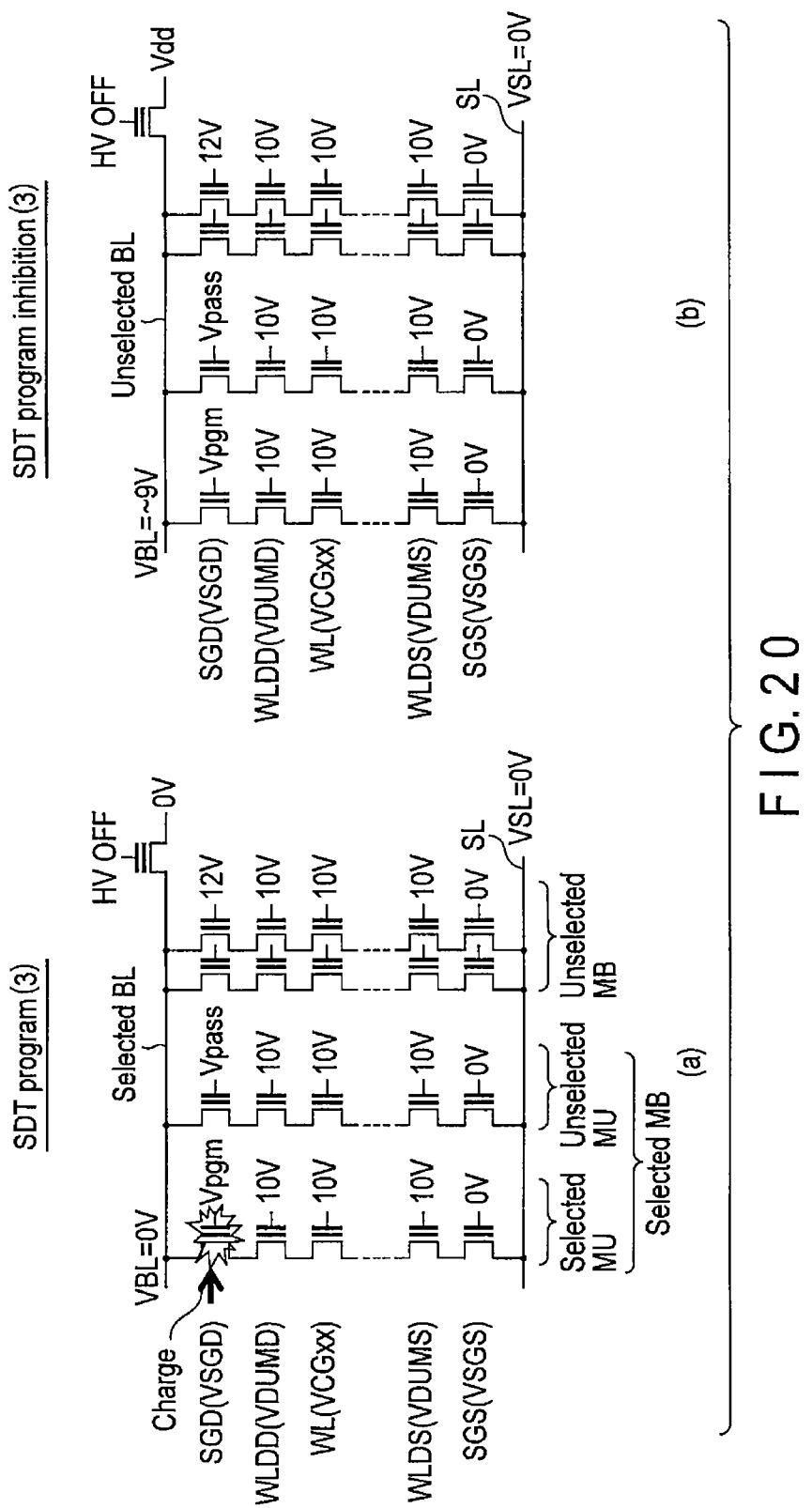
FIG. 20 is a diagram to explain a third step of the program operation of the drain-side select transistor.

FIG. 20 is a diagram to explain a third step of the program operation of the drain-side select transistor SDT. The control circuit 5 applies a write voltage Vpgm (for example, 20 V) only to selected select gate line SGS (connected to the selected memory unit). As a result, in select transistor SDT in the selected memory unit to be connected to the selected bit line BL, the gate voltage has reached Vpgm, causing programming to be performed. In select transistor SDT connected to the unselected bit line BL, the bit line voltage VBL has been raised to 9 V, with the result that the potential difference between the gate and channel is "Vpgm−9 V," decreasing the electric field, which inhibits programming.

As described above, only use of the high-voltage transistor HV connected to a bit line BL enables 0 to 9 V to be selectively applied to each bit line BL. Therefore, the writing method can be realized without increasing the core circuit area.

In addition, when the high-voltage transistor is turned off, the gate voltage is set to an intermediate potential, such as Vdd, not to 0 V, thereby producing a state where 0 V is transferred, but Vdd is not transferred. In this case, the unselected bit line BL is electrically disconnected from the sense circuit 3, maintaining 9 V. However, 0 V at the selected bit line BL is electrically connected to the sense circuit 3 in writing by FN tunnel current, enabling 0 V to be stably maintained. This makes it possible to perform a more highly reliable program operation of select transistor SST.

After select transistor SDT has been programmed, the threshold voltage of select transistor SDT is verified (steps S103, S104). If the threshold voltage has not reached Vth_target yet, programming will be further performed. At this time, it is desirable that a write voltage Vpgm should be raised stepwise each time the number of times programming is performed increases. Then, a loop composed of a verify operation and a program operation is repeated so that the threshold voltages of all select transistor SDTs may be greater than or equal to Vth_target.

As described above in detail, with the third embodiment, applying the write voltage Vpgm to the gate of select transistor SDT enables the select transistor to be programmed using FN tunnel current. Therefore, the third embodiment also produces the same effect as that of the first embodiment.

Fourth Embodiment

In a semiconductor memory device in the initial state (before product shipment), when the threshold voltages of select transistors SDT and SST are much lower than Vth_target, the threshold voltage of a select transistor to be verified might not be determined accurately due to a leakage current from a memory unit included in an unselected block. In this case, the way the threshold voltages of one or more memory cell transistors in a memory unit are programmed in positive values over the entire memory cell array is effective. At this time, there is no need to accurately verify a memory cell transistor to be programmed.

Figure 21:
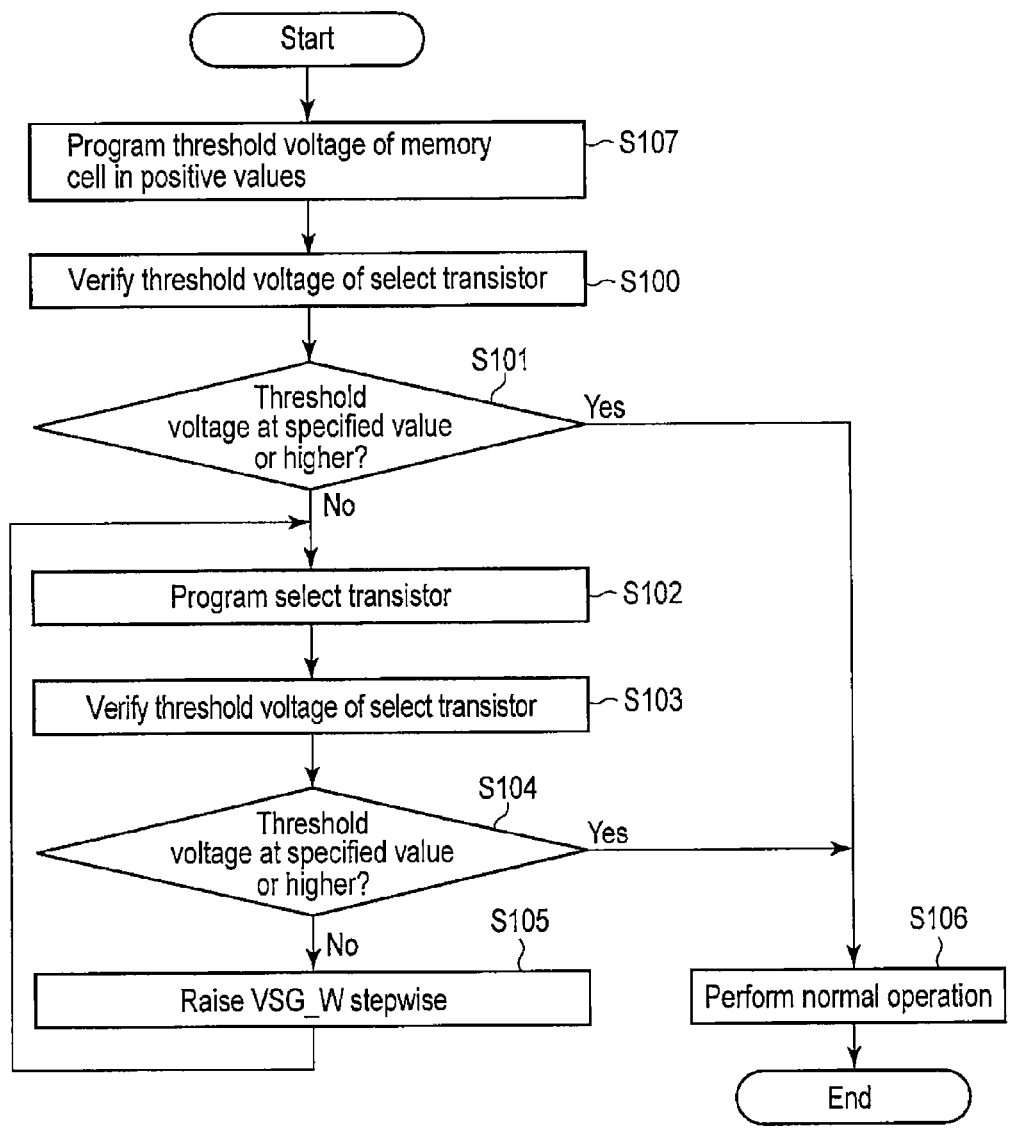
FIG. 21 is a flowchart to explain the operation of adjusting the threshold of a select transistor according to a fourth embodiment.

FIG. 21 is a flowchart to explain the operation of adjusting the threshold of the select transistor with the control circuit 5 according to a fourth embodiment. In FIG. 21, in a first step (step S107), the threshold voltages of one or more memory cell transistors MTs are programmed in positive values in each memory unit MU included in the memory cell array 1.

The control circuit 5 sets to 0 V a word line WL to be connected to the memory cell transistor MT programmed in step S107 of the word lines WLs in an unselected block in verifying the select transistor (steps S100, S103). As a result, a current flowing through a memory unit in the unselected block is cut off by a memory string, regardless of the threshold voltages of select transistors SDT and SST before programming. Therefore, a more accurate verify operation of the select transistors can be realized. It is desirable that the data in the programmed memory cell transistor should be erased after the adjustment of the threshold voltage of the select transistor has been completed. Alternatively, dummy transistors DTD and DTS may be used as objects to be programmed in step S107.

Next, a first technique for reducing a leakage current from an unselected memory unit in the selected block including a select transistor to be programmed will be explained.

The first technique is to perform a loop composed of the step of verifying the threshold voltage of a select transistor and the step of programming the select transistor once on each of a plurality of select transistors included in the same block. More specifically, when a block includes select gate lines SGD0 to SGD15 and SGS0 to SGS15, a first loop is performed on the select transistors connected to all of select gate lines SGD0 to SGD15 and SGS0 to SGS15.

Then, after the threshold voltages of the select transistors have been verified, a second program operation is performed on the ones whose threshold voltages are determined to be lower than Vth_target of the select transistors connected to select gate lines SGD0 to SGD15 and SGS0 to SGS15. Then, after the threshold voltages of the select transistors have been verified, a third program operation is performed on the ones whose threshold voltages are determined to be lower than Vth_target of the select transistors connected to select gate lines SGD0 to SGD15 and SGS0 to SGS15. After this, similarly, the loop is repeated until the threshold voltages of all the select transistors in the same block have become greater than or equal to Vth_target. By such operations, the ones whose threshold voltages are lower than Vth_target of all the select transistors in the same block can be raised in threshold voltage equally (stepwise).

As a result, when a select transistor whose threshold voltage is extremely low is included in a block, it is possible to reduce an erroneous operation of executing excessive programming as a result of determining the threshold voltage of a select transistor to be programmed to be lower erroneously due to a leakage current from the memory unit.

Next, a second technique for decreasing a leakage current from an unselected memory unit in the selected block including a select transistor to be programmed will be explained.

The second technique is to bias VSL a little positively to offset all the voltages and operate the select transistors when the threshold voltages of the select transistors are verified. For example, if the threshold voltages of select transistors SDT and SST might drop as low as −1 V, setting is done so as to give VSL=1 V and VBL=1.5 V. When needed, VSGD, VDUMD, VCG, VDUMS, VSGS, and Vth_target are also offset by +1 V. By doing this, a leakage current is suppressed even if a select transistor whose threshold voltage is negative is included in the block, enabling a suitable verify operation. Once the threshold voltages of all the select transistors have been guaranteed to be positive, the offset of VSL is terminated and setting is done to give VSL=0 V, enabling a verify operation to be performed under almost the original reading conditions.

As described above in detail, with the fourth embodiment, a leakage current from an unselected memory unit can be reduced in verifying a select transistor. As a result, even if there is a select transistor whose threshold voltage in the initial state is negative, the threshold voltage of a select transistor to be programmed can be determined accurately. Consequently, the threshold voltages of the select transistors can be optimized further.

In each of the above embodiments, dummy cells are not necessarily used as described above. When a dummy cell is used as a memory cell, voltage control of a memory cell adjacent to a select transistor has only to be replaced with voltage control of the aforementioned dummy cell.

While in each of the above embodiments, the explanation has been given using a stacked NAND flash memory where memory cells have been arranged three-dimensionally, the invention is not limited to this. For instance, the invention may be applied to a planar NAND flash memory where memory cells are arranged two-dimensionally.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   memory units each of which includes first and second select transistors and memory cells connected in series between the first and second select transistors;
   first and second select gate lines connected to gates of the first and second select transistors, respectively;
   word lines connected to gates of the memory cells, respectively;
   a bit line connected to the first select transistor;
   a source line connected to the second select transistor; and
   a control circuit configured to perform voltage control of the memory units,
   wherein the control circuit:
   applies a first potential difference between a source and a drain of either the first or second select transistor in a first memory unit, thereby programming either the first or second select transistor,
   applies a second potential difference lower than the first potential difference between a source and a drain of either a third or fourth select transistor in a second memory unit connected in common to a same select gate line as that of the first memory unit, thereby inhibiting either the third or fourth select transistor from being programmed, and
   raises a body potential of a third memory unit using capacitive coupling by a voltage applied to the word line and transfers the raised body potential to the bit line when programming either the first or second select transistor, the third memory unit not sharing the word lines with the first memory unit.

2. The device of claim 1, wherein the control circuit programs the first select transistor and applies a first voltage to the bit line and a second voltage to the gate of the first select transistor in a state where a memory cell adjacent to the first select transistor has been pinched off.

3. The device of claim 1, wherein the control circuit programs the second select transistor and applies a first voltage to the source line and a second voltage to the gate of the second select transistor in a state where a memory cell adjacent to the second select transistor has been pinched off.

4. The device of claim 1, wherein the control circuit generates the first or second potential difference using the raised potential transferred to the bit line.

5. The device of claim 2, wherein the control circuit performs a verify operation for determining a threshold voltage of the first select transistor before programming the first select transistor.

6. The device of claim 3, wherein the control circuit performs a verify operation for determining a threshold voltage of the second select transistor before programming the second select transistor.

7. The device of claim 5, wherein the control circuit repeats loops each including a verify operation and a program operation and raises at least one of the first voltage and the second voltage stepwise in the loops.

8. The device of claim 5, wherein the control circuit repeats loops each including a verify operation and a program operation and lowers a gate voltage of the memory cell adjacent to the first select transistor stepwise in the loops.

9. The device of claim 5, wherein the control circuit programs at least one of the memory cells and applies an off voltage to a gate of the programmed memory cell included in the third memory unit not sharing the word lines with the first memory unit in the verify operation.

10. The device of claim 5, wherein the control circuit makes a voltage of the source line higher than a ground voltage in the verify operation.

11. The device of claim 1, further comprising a MOS transistor connected to the bit line and configured to bring the bit line into a floating state in charging the bit line.

12. The device of claim 1, wherein the memory cells are stacked vertically and share a pillar-shaped semiconductor layer.

13. A semiconductor memory device comprising:
    memory units each of which includes first and second select transistors and memory cells connected in series between the first and second select transistors, the memory cells being stacked vertically and sharing a pillar-like semiconductor layer;
    first and second select gate lines connected to gates of the first and second select transistors, respectively;
    word lines connected to gates of the memory cells, respectively;
    a bit line connected to the first select transistor;
    a source line connected to the second select transistor; and
    a control circuit configured to perform voltage control of the memory units,
    wherein the control circuit:
    applies a write voltage to a gate of the first select transistor included in a first memory unit, thereby programming the first select transistor,
    applies a first voltage to the bit line connected to a third select transistor included in a second memory unit connected in common to a same select gate line as that of the first memory unit, thereby inhibiting the third select transistor from being programmed, and
    raises a body potential of a third memory unit using capacitive coupling by a voltage applied to the word line and transfers the raised body potential to the bit line when programming the first select transistor, the third memory unit not sharing the word lines with the first memory unit.

14. The device of claim 13, wherein the control circuit performs a verify operation for determining a threshold voltage of the first select transistor before programming the first select transistor.

15. The device of claim 14, wherein the control circuit repeats loops each including a verify operation and a program operation and raises the write voltage stepwise in the loops.

16. The device of claim 14, wherein the control circuit programs at least one of the memory cells and applies an off voltage to a gate of the programmed memory cell included in the third memory unit not sharing the word lines with the first memory unit in the verify operation.

17. The device of claim 13, further comprising a MOS transistor connected to the bit line and configured to bring the bit line into a floating state in charging the bit line.

* * * * *